United States Patent
Suzuki

(10) Patent No.: US 8,854,108 B1
(45) Date of Patent: Oct. 7, 2014

(54) SIGNAL TRANSMISSION CIRCUIT, SEMICONDUCTOR INTEGRATED CIRCUIT, AND SIGNAL TRANSMISSION CIRCUIT ADJUSTMENT METHOD

(71) Applicant: Fujitsu Limited, Kawasaki (JP)

(72) Inventor: Kosuke Suzuki, Ota (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/154,613

(22) Filed: Jan. 14, 2014

(30) Foreign Application Priority Data

Mar. 26, 2013 (JP) ................. 2013-064523

(51) Int. Cl.
*H03K 17/16* (2006.01)
*H03K 3/011* (2006.01)

(52) U.S. Cl.
CPC ....................................... *H03K 3/011* (2013.01)
USPC .............. 327/379; 327/108; 326/30; 375/257

(58) Field of Classification Search
CPC . H03K 17/54; H03K 17/162; H03K 17/0822; H04L 25/0278; H04L 25/0298; H04L 25/0272; H04L 25/0292; H04L 25/028; H03K 19/0005; H03K 19/00361; H03K 19/00315
USPC ......... 327/108–112, 170, 379, 389, 391, 427, 327/434, 437; 326/82, 83, 87, 21, 26, 30; 375/257

See application file for complete search history.

(56) References Cited

U.S. PATENT DOCUMENTS

| | | | | |
|---|---|---|---|---|
| 7,633,310 B2 * | 12/2009 | Fukushi | ........................... | 326/30 |
| 7,944,226 B2 * | 5/2011 | Sasajima | .................. | 324/756.01 |
| 7,956,638 B2 * | 6/2011 | Iizuka et al. | .................... | 326/30 |
| 2007/0194805 A1 | 8/2007 | Kim et al. | | |
| 2008/0180130 A1 | 7/2008 | Hayami et al. | | |
| 2014/0111250 A1 * | 4/2014 | Li et al. | ......................... | 327/108 |

FOREIGN PATENT DOCUMENTS

| | | |
|---|---|---|
| JP | 2007-228585 | 9/2007 |
| JP | 2008-182516 | 8/2008 |
| JP | 2011-239467 | 11/2011 |

* cited by examiner

*Primary Examiner* — Lincoln Donovan
*Assistant Examiner* — Thomas Skibinski
(74) *Attorney, Agent, or Firm* — Fujitsu Patent Center

(57) ABSTRACT

A transmission circuit is formed such that plural driver units of each driver circuit are connected together in parallel. A code setting section detects a voltage Vms output from a replica circuit corresponding to a driver unit of a driver circuit, and detects a voltage Vmo output from a replica circuit corresponding to one driver unit of the driver circuit, and based on a ratio of the voltages Vms, Vmo, sets operation numbers Na to Nd of driver units for each of the driver circuits such that the output resistance value of each of the driver circuits becomes pre-set output resistance values Roa to Rod. The driver circuit has a number of driver units according to the operation number connected together in parallel and operating.

15 Claims, 22 Drawing Sheets

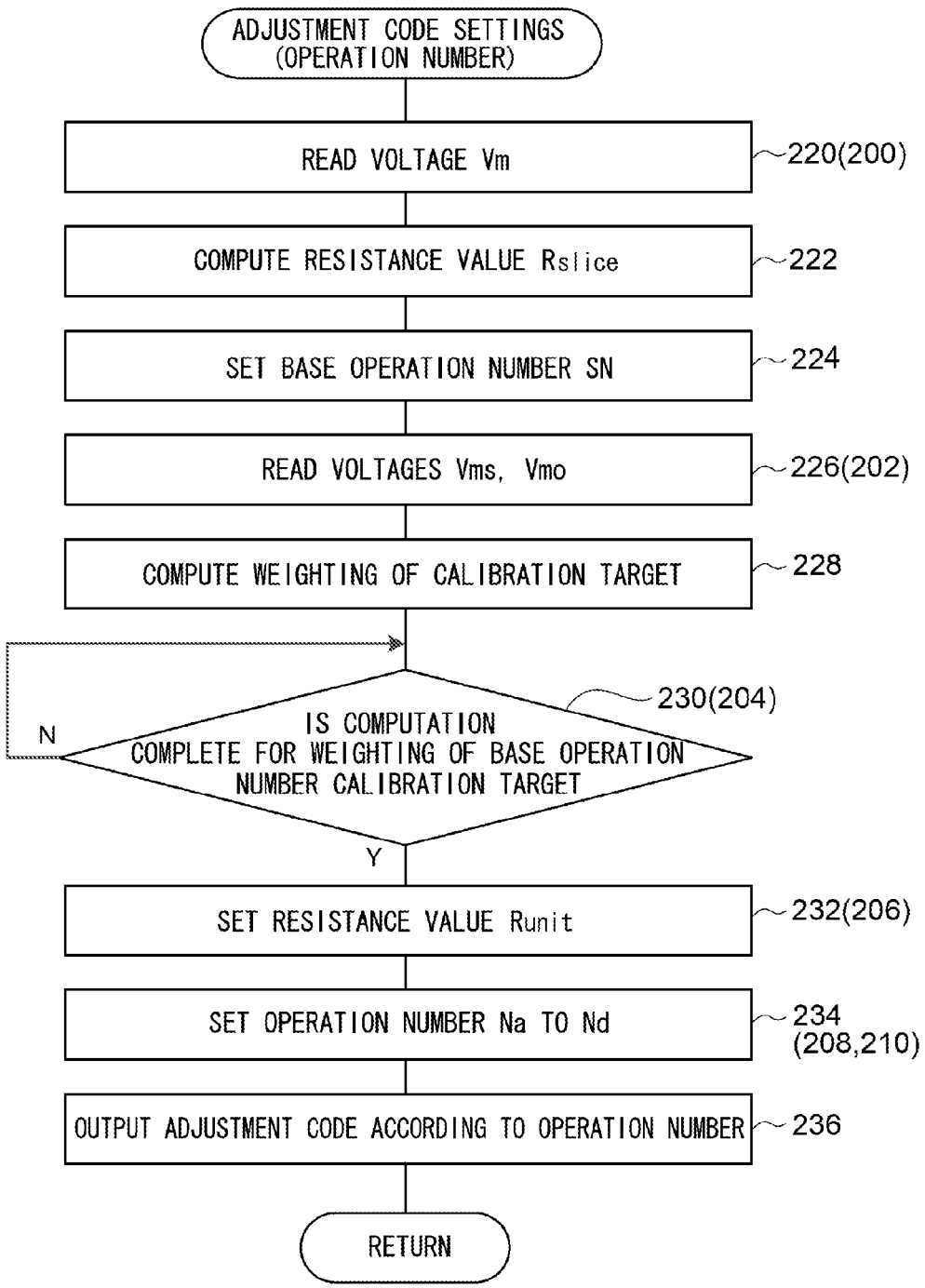

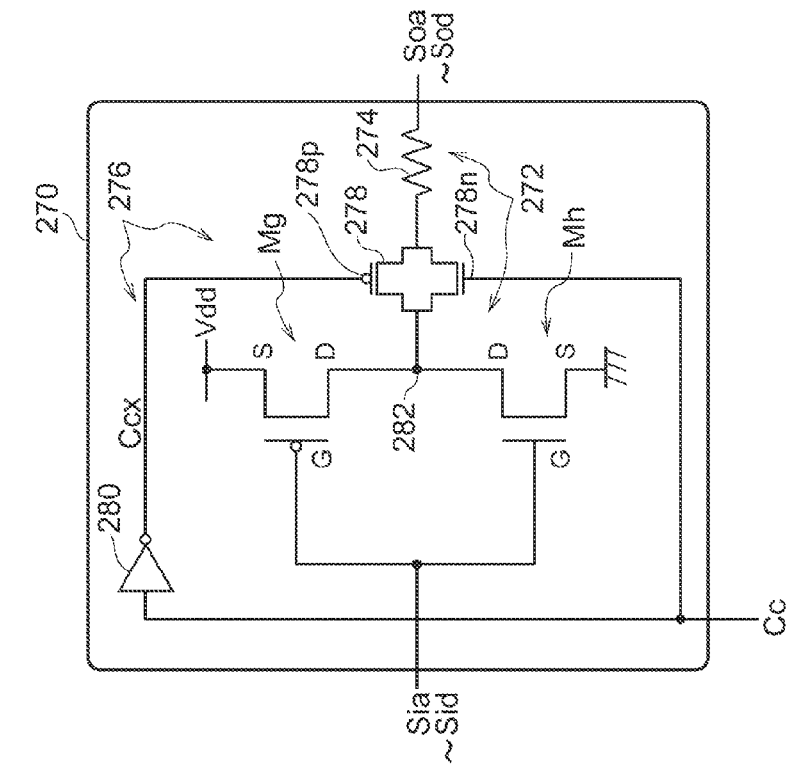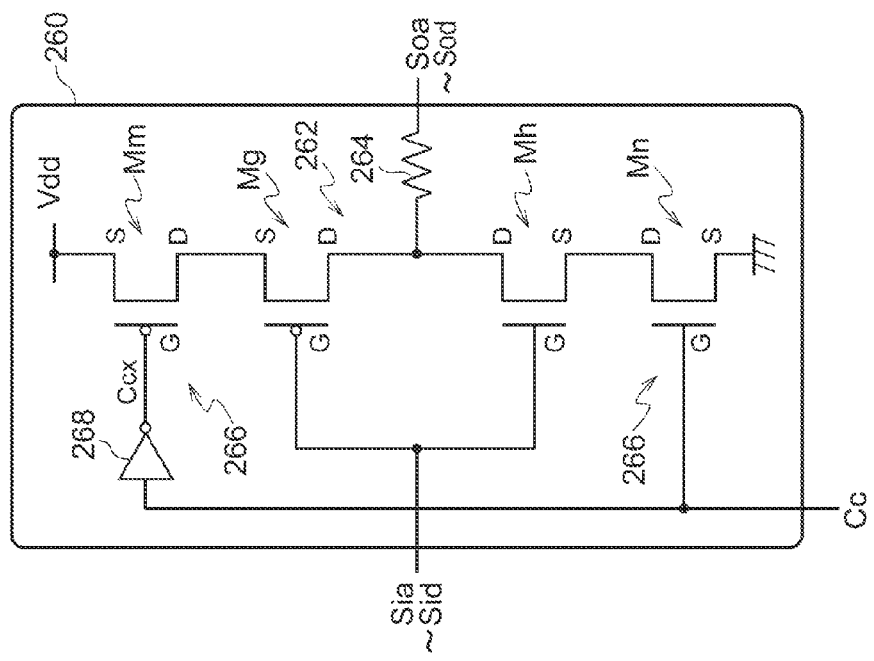

SIGNAL TRANSMISSION CIRCUIT, SEMICONDUCTOR INTEGRATED CIRCUIT, AND SIGNAL TRANSMISSION CIRCUIT ADJUSTMENT METHOD

CROSS-REFERENCE TO RELATED APPLICATION

This application is based upon and claims the benefit of priority of the prior Japanese Patent Application No. 2013-064523, filed on Mar. 26, 2013, the entire contents of which are incorporated herein by reference.

FIELD

The embodiments discussed herein are related to a signal transmission circuit, a semiconductor integrated circuit, and a signal transmission circuit adjustment method.

BACKGROUND

As a data output drive circuit provided to a semiconductor storage device, there is a proposal for a data output drive circuit corresponding to plural drive impedances. The data output drive circuit is provided with a driver that has an output impedance that is the lowest common multiple of the plural drive impedances, and a driver that has an output impedance that is a sub-multiple of the lowest common multiple, with these in a parallel layout, and a driver sets the parallel connections according to the drive impedance. In order to adjust the output impedance, the driver is formed with plural PMOS transistor pull-up drivers that are respectively connected to resistors, and with plural NMOS transistor pull-down drivers that are respectively connected to resistors.

However, in a semiconductor integrated circuit, the resistance values of transistors and resistors fluctuate due to variations in the manufacturing processes and to temperature fluctuations. There is a proposal as an interface circuit of a semiconductor integrated circuit for an interface circuit equipped with a calibration circuit for adjusting the ON resistance of transistors provided to the driver circuit. The interface circuit is equipped with a driver circuit that combines plural transistors, and an end terminal resistor. The calibration circuit uses a constant current source to detect changes in an ON resistance value of an N-channel MOSFET, in an ON resistance value of a P channel MOSFET, and in a resistance value of a resistor, and selectively switches ON plural transistors in the driver circuit based on the detection result. The interface circuit matches the overall resistance value of the transistor ON resistance and final terminal resistance of the driver circuit to the characteristic impedance of the transmission path so as not to vary with changes in the manufacturing processes and temperature fluctuations.

As an output buffer circuit that transmits a logical signal to the transmission path, there is a proposal for an output buffer circuit that applies pre-emphasis to a transmission output waveform in order to compensate for signal attenuation occurring in the transmission path. This output buffer circuit is provided with P-type transistors and N-type transistors that operated in a complementary manner to each other in plural respective buffer circuits, such that the output impedance is constant irrespective of the output voltage. By setting the output buffer circuit with a range in which the output impedance matches the characteristic impedance of the transmission path for each of the buffers, the output impedance of the output buffer circuit is matched to the characteristic impedance of the transmission path. The output buffer circuit is also provided with switches to the plural buffers, and to adjust the amount of pre-emphasis and the number of pre-emphasis taps, the number of buffers that are ON at the same time is limited so as to match the output impedance to the characteristic impedance of the transmission path.

RELATED PATENT DOCUMENTS

Japanese Laid-Open Patent Publication No. 2007-228585
Japanese Laid-Open Patent Publication No. 2008-182516
Japanese Laid-Open Patent Publication No. 2011-239467

SUMMARY

According to an aspect of the embodiments, a signal transmission circuit includes: a plurality of driver circuits that each include a plurality of operation unit circuits formed so as to have a specific output resistance value and to operate so as to output a voltage according to an input signal, an output resistance value of the operation unit circuits being set according to a pre-set output resistance value for each of the plurality of driver circuits, with an operation number of the operation unit circuits connected together in parallel and operated determined by setting the operation number of the operation unit circuits, such that signals are output from the plurality of driver circuits with a voltage according to the input signal, and with the plurality of driver circuits connected together in parallel such that the output signals are combined together; an individual detection section that includes replica circuits provided corresponding to at least 2 driver circuits out of the plurality of driver circuits and having resistance values corresponding to the output resistance values of one operation unit circuits, and that detects an output voltage of each of the replica circuits; and a setting section that computes a ratio based on output resistance value of each of the plurality of driver circuits for at least one of driver circuits based on a voltage ratio between an output voltage of a replica circuit corresponding to one driver circuit out of the at least 2 driver circuits and an output voltage of a replica circuit corresponding to another driver circuit out of the at least 2 driver circuits detected by the individual detection section, and sets an operation number of operation unit circuits to operate in each of the plurality of driver circuits from the ratio based on the output resistance value computed for the at least one of the driver circuits and a ratio based on the pre-set output resistance values for the plurality of driver circuits so as to make the output resistance value of each of the plurality of driver circuits be the pre-set output resistance value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 20 is a flow diagram illustrating an example of processing of an adjustment control section according to the seventh exemplary embodiment;

FIG. 21A and FIG. 21B are circuit diagrams illustrating other examples of switching circuits provided to driver units.

DESCRIPTION OF EMBODIMENTS

Detailed explanation follows regarding an example of an exemplary embodiment of technology disclosed herein, with respect to the drawings.

First Exemplary Embodiment

Figure 1:
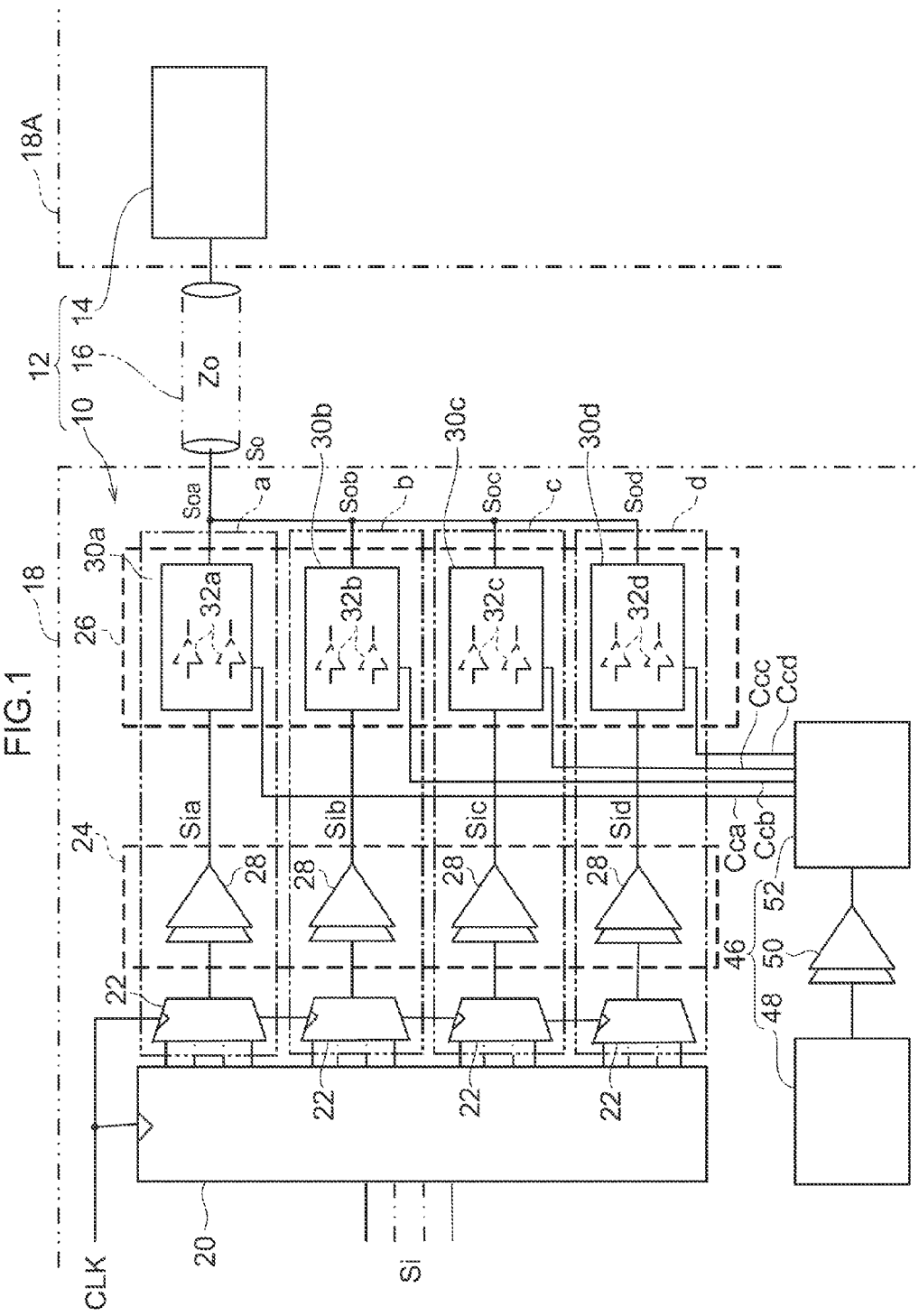
FIG. 1 is block diagram illustrating an example of a transmission circuit according to a first exemplary embodiment.

FIG. 1 illustrates a transmission circuit 10 according to a first exemplary embodiment. The transmission circuit 10 functions as an example of a signal transmission circuit according to technology disclosed herein. The transmission circuit 10 is incorporated into a signal transmission device 12. The signal transmission device 12 includes the transmission circuit 10, a reception circuit 14 and a transmission line 16. The transmission circuit 10 is connected to one end of the transmission line 16, and the reception circuit 14 is connected to the other end of the transmission line 16.

Data for transmission is input to the transmission circuit 10 as an input signal Si. The transmission circuit 10 generates a transmission signal So of voltage waveform according to the input signal Si, and outputs the generated transmission signal So to the transmission line 16. The signal transmission device 12 thereby transmits to the reception circuit 14 data according to the input signal Si, through the transmission line 16.

The signal transmission device 12 functions as a portion of an interface that connects together various functional components. The transmission circuit 10 of the signal transmission device 12 is provided to a semiconductor integrated circuit 18. The semiconductor integrated circuit 18 functions as an example of a semiconductor integrated circuit of the first exemplary embodiment. The reception circuit 14 of the signal transmission device 12 is, for example, provided to a semiconductor integrated circuit 18A that is separate to the semiconductor integrated circuit 18. The signal transmission device 12 thereby transmits data from the semiconductor integrated circuit 18 to the semiconductor integrated circuit 18A.

In the signal transmission device 12, the reception circuit 14 however may, for example, be provided to the same semiconductor integrated circuit 18 as the transmission circuit 10, and may perform data transmission between different block circuits within the semiconductor integrated circuit 18. Moreover, in the signal transmission device 12, the transmission circuit 10 may be appropriately applied to data transmission within the same circuit board, or may be appropriately applied to data transmission between different circuit boards, such as for data transmission through a backplane to between different circuits such as daughter cards (daughter boards). Moreover, in the signal transmission device 12, the transmission circuit 10 may be provided for example to servers or signal processing apparatuses, and may be appropriately applied to data transmission between different servers or between different signal processing apparatuses.

As illustrated in FIG. 1, the transmission circuit 10 includes a signal converter 20 input with the input signal Si, plural multiplexers 22, a pre-driver section 24, and a final drive section (referred to below as drive section) 26. The transmission circuit 10 includes an adjustment control section 46. In the present exemplary embodiment, parallel signals (parallel data) is applied as an example of the input signal Si, and the signal converter 20 splits and outputs the parallel signal input signal Si to each of the plural multiplexers 22. The signal converter 20 functions as an example of a splitter section of the first exemplary embodiment.

The multiplexers 22 for each tap operate in synchronization to a clock signal CLK, and convert the parallel signal into a serial signal (parallel-serial conversion) and output the serial signals. By performing parallel-serial conversion, the transmission circuit 10 outputs the transmission signal So at a high transmission speed with respect to the transmission speed of the Si. Note that a serial signal may be employed as the input signal Si instead of a parallel signal, an in such cases the multiplexers 22 may be omitted.

The pre-driver section 24 includes pre-driver circuits 28 corresponding to each of the plural multiplexers 22. The pre-driver circuits 28 output a voltage signal according to the signal input from the respective multiplexers 22. The drive section 26 includes plural driver circuits 30 corresponding to each of the pre-driver circuits 28. Each of the driver circuits 30 outputs a voltage signal according to the signal input from the respective pre-driver circuits 28. The transmission circuit 10 combines together the signals output from each of the driver circuits 30, and outputs the combined signal as transmission signal So. Namely, in the transmission circuit 10 the plural driver circuits 30 are arrayed in parallel, and the multiplexers 22 and the pre-driver circuits 28 are provided to correspond to each of the driver circuits 30, and the input signal Si is split into plural signals by the signal converter 20 for each of the plural driver circuits 30. The driver circuits 30 function as an example of plural driver circuits of the first exemplary embodiment.

The driver circuits 30 each include plural respective driver units 32. In each of the driver circuits 30, by setting the number of the driver units 32 that are to be operated from out of the plural driver units 32 (referred to below as the operation number), the set operation number of the driver units 32 are connected in parallel and operated. In each of the driver circuits 30, the overall value of output resistance value of the driver units 32 connected in parallel is the output resistance value of each of the driver circuits 30. In the transmission circuit 10, the overall value of the output resistance value of the plural driver circuits 30 becomes the final resistance value (end terminal impedance) due to connecting the plural driver circuits 30 together in parallel. The transmission circuit 10 is pre-set such that the final terminal resistance value matches the characteristic impedance of the transmission line 16. The adjustment control section 46 adjusts such that the transmission circuit 10 has the pre-set final terminal resistance value by controlling the operation number of the driver units 32 in each of the driver circuits 30.

The transmission circuit 10 includes a Feed Forward Equalizer (FFE) function, and for example performs de-emphasis using the FFE function. The de-emphasis is one method of compensating for loss of high frequency signals such as in the transmission line 16, and the transmission circuit 10 generates as the transmission signal So a signal in which the low frequency components are attenuated with respect to the high frequency components in advance. When this is performed, the transmission circuit 10 splits the input signal Si into plural signals and generates the transmission signal So by performing for example delaying or polarity reversal on each of the split signals, followed by combining. In the present exemplary embodiment explanation follows regarding an example in which the number of branches is 4 (4 taps), with these taps denoted tap a, tap b, tap c, and tap d. In the following explanation, the basic configuration of the functional components corresponding to the taps a to d are the same as each other, and the suffixes a to d are appended thereto when particular discrimination is made therebetween.

The transmission circuit 10 includes the respective multiplexers 22 and the respective pre-driver circuits 28 for each of the taps. The transmission circuit 10 is provided with the driver circuit 30a corresponding to the tap a, the driver circuit 30b corresponding to the tap b, the driver circuit 30c corresponding to the tap c, and the driver circuit 30d corresponding to the tap d. Note that since the driver circuits 30a to 30d have basically the same configuration as each other, they are denoted driver circuits 30 when no discrimination is being made between the driver circuits 30a to 30d.

In order to perform de-emphasis, the signal converter 20 of the transmission circuit 10 is set with a delay time and whether or not to perform polarity reversal for each of the taps a to d. The signal converter 20 performs delay and polarity reversal on the input signal Si based on the settings for each of the taps a to d and then outputs the signals. The driver circuits 30a to 30d are thereby input from the pre-driver circuits 28 with signals Sia, Sib, Sic, Sid, these being the input signal Si converted according to the delay time and whether or not to perform polarity reversal set in the taps a to d. The driver circuits 30a to 30d output voltage signals Soa to Sod according to the signals Sia to Sid input from the pre-driver circuits 28. The transmission circuit 10 combines the signals Soa to Sod output from the driver circuits 30a to 30d and outputs the combined signal as the transmission signal So. The signals Sia to Sid function as an example of signals input to each of the driver circuits in the first exemplary embodiment, and the signals Soa to Sod function as an example of signals output from each of the driver circuits in the first exemplary embodiment.

The transmission circuit 10 performs weighting between the taps a to d, also employs weighting with respect to the taps a to d to de-emphasize the transmission signal So in addition to applying or not applying time delaying and polarity reversal to each of the taps a to d. The transmission circuit 10 employs a ratio based on the output resistance values of the driver circuits 30a to 30d of the taps a to d to weight the taps a to d. When performing weighting, as the ratio based on the output resistance values of the driver circuits 30a to 30d, the transmission circuit 10 employs an inverse ratio of the ratio of output resistance values. In the present exemplary embodiment, the inverse ratio is employed as weightings W (Wa to Wd). The transmission circuit 10 sets the degree of de-emphasis (degree of attenuation of the low frequency component) by combining delay time and whether or not to perform polarity reversal on each of the taps a to d with the weightings Wa to Wd for each of the taps a to d. In the following, output resistance values of each of the driver circuits 30a, 30b, 30c, 30d are respectively referred to as overall resistance values Roa, Rob, Roc, Rod. The overall resistance values Roa, Rob, Roc, Rod are referred to collectively as overall resistance value Ro. The overall resistance values Roa, Rob, Roc, Rod function as an example of output resistance values of each of the driver circuits in the first exemplary embodiment. The weightings Wa to Wd function as an example of a ratio based on output resistance values each of the driver circuits in the present exemplary embodiment.

Figure 2:
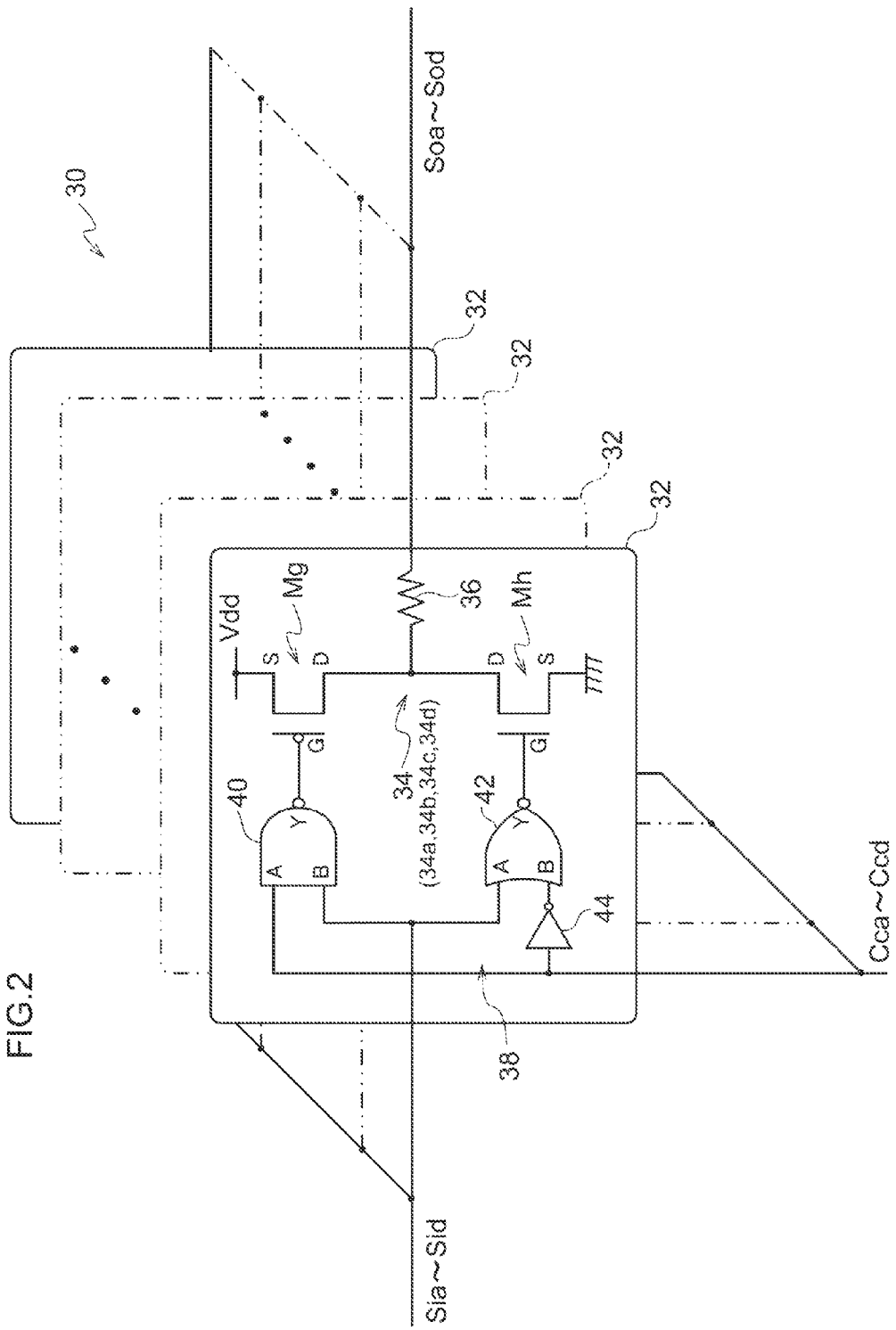
FIG. 2 is a circuit diagram illustrating an example of a drive circuit.

A driver circuit 30 of one of the taps is illustrated in FIG. 2. The driver circuit 30 includes plural driver units 32. The driver units 32 as an example each contain a unit circuit 34 that employs source series terminated (SST) operation to operate in voltage mode. The driver units 32 function as an example of operation unit circuit in the present exemplary embodiment.

The unit circuits 34 each includes a transistor Mg for which a PMOS transistor is employed, and a transistor Mh for which a NMOS transistor is employed. The unit circuits 34 are connected such that a voltage Vdd is applied to the source S of the transistor Mg, and the source S of the transistor Mh is connected to ground. In the unit circuit 34, the drain D of the transistor Mg and the drain D of the transistor Mh are connected together, and the connection point thereof is connected to one end of a resistance element 36. The unit circuits 34 each accordingly function as an inverter in which the transistors Mg, Mh operate in a complementary manner, is operated by input of the signals Sia to Sid, and in which the transistors Mg, Mh are driven according to the signals Sia to Sid.

The output resistance value of each of the driver units 32 is determined by resistance Rt when the transistors Mg, Mh of the unit circuits 34 are operated, and resistance value R of the resistance element 36. The transistors Mg, Mh, and the resistance element 36 function as resistance elements. The output resistance values of the driver units 32 are made constant by operating the transistors Mg, Mh of the unit circuits 34 in a complementary manner. The driver units 32 are formed such that the output resistance values achieve a pre-set unit resistance value Rx. The unit resistance value Rx functions as an example of an output resistance value of an operation unit circuit in the first exemplary embodiment.

Figure 3:
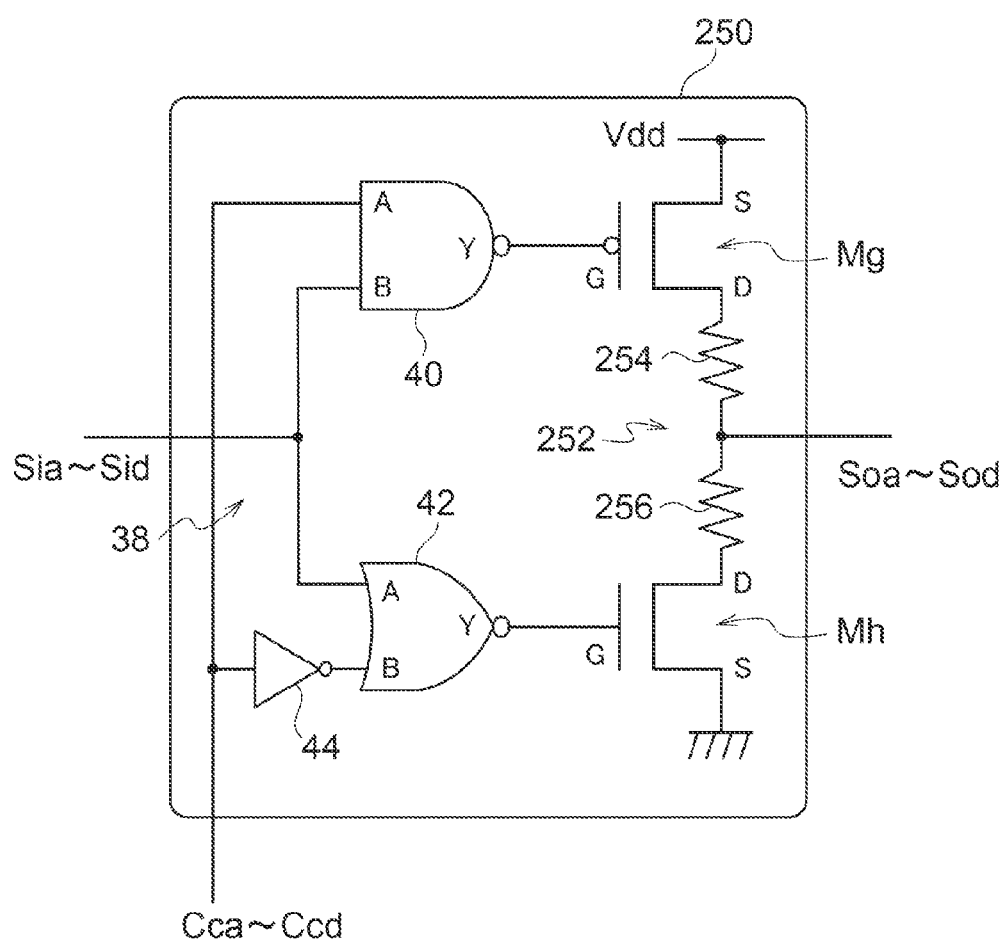
FIG. 3 is a circuit diagram illustrating an example of another driver unit employed in a driver circuit.

The driver circuit 30 is not limited to the driver units 32, and various configurations equipped with the transistors Mg, Mh that operate in a complementary manner may be employed. FIG. 3 illustrates an example of a driver unit that may be provided in place of the driver units 32 in the driver circuit 30. The driver unit 250 illustrated in FIG. 3 includes a unit circuit 252. In the unit circuit 252 the drain D of the transistor Mg is connected to the drain D of the transistor Mh through two serially connected resistor elements 254, 256. Switching the transistor Mg OFF and switching the transistor Mh ON makes the output resistance value of the driver unit 250 an overall resistance value of transistor Mh and resistor element 256. Switching the transistor Mh OFF and switching the transistor Mg ON makes the output resistance value of the driver unit 250 an overall resistance value of transistor Mg and resistor element 254.

The driver unit 250 accordingly functions as an electrical equivalent to the driver units 32 by making the resistance value of each of the resistor elements 254, 256 the same as the resistance value R of the resistance element 36. The operation unit circuit of technology disclosed herein is not limited to the driver units 32 and any circuit that functions to obtain and output a desired resistance value may be employed therefor. For example, the operation unit circuit may formed from active elements such as transistors alone, may be formed from resistor elements alone, and may include further other functional components.

Figure 4:
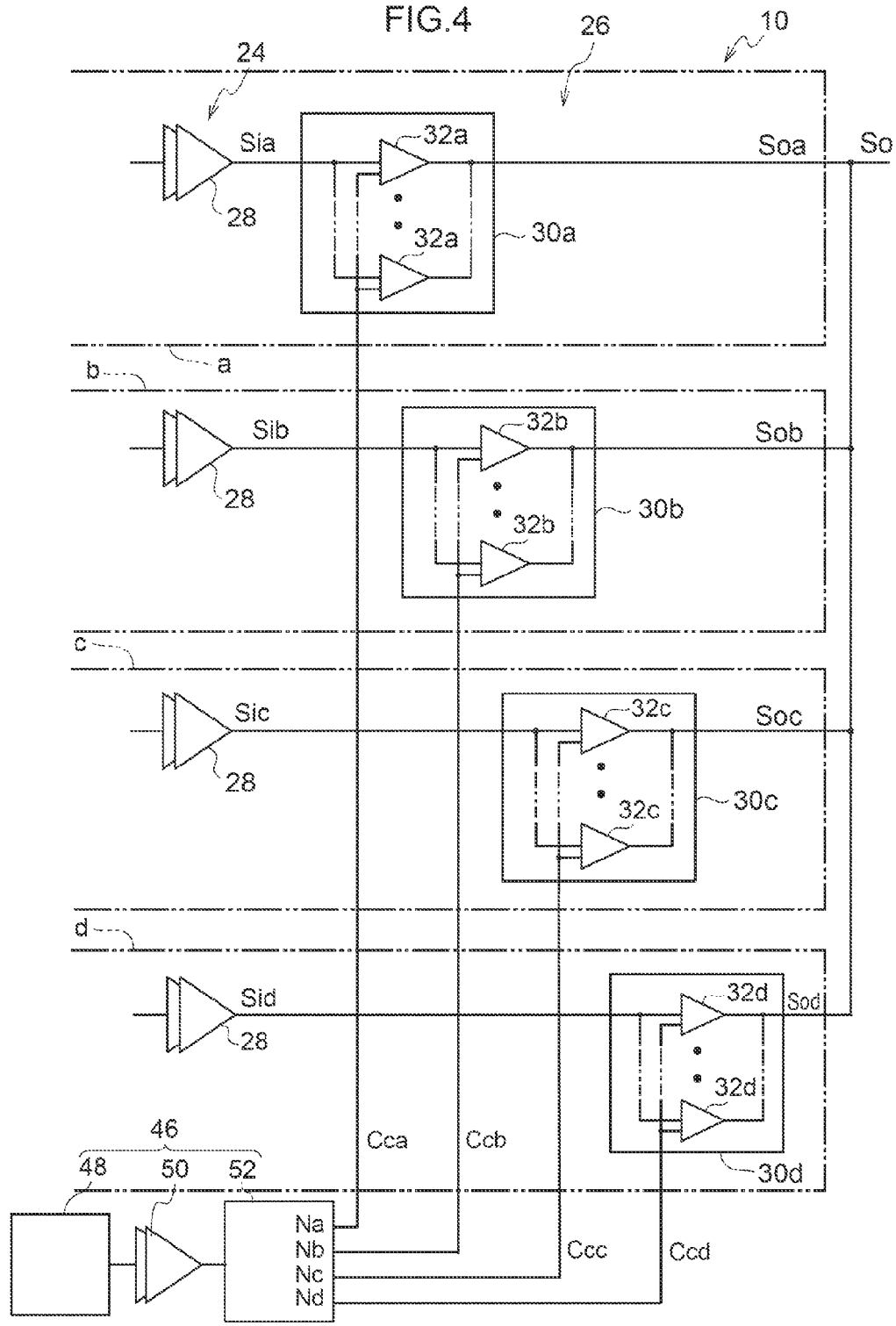
FIG. 4 is a functional block diagram of relevant portions of a transmission circuit according to a first exemplary embodiment.

As illustrated in FIG. 1 and FIG. 4, plural of the driver units 32 are formed in a parallel layout in each of the driver circuits 30a to 30d. The transistor size of the transistor Mg and the transistor Mh of the driver units 32 (the unit circuits 34, see FIG. 2) are formed so as to achieve similar resistance value Rt between the driver circuits 30a to 30d. Moreover, the resistance value R of the resistance element 36 (see FIG. 2) provided in each of the unit circuits 34 of the driver units 32 is different between the driver circuits 30a to 30d. In the following reference is made to the driver units 32a to 32d when discriminating between the respective driver units 32 provided to the driver circuits 30a to 30d. Moreover, in the following reference is made to the unit circuits 34a, 34b, 34c, 34d when discrimination is made between the unit circuits 34 of the driver units 32a, 32b, 32c. 32d. Moreover, in the following reference is made to the resistance elements 36a, 36b, 36c, 36d when discriminating between the resistance elements 36 of the driver units 32a to 32d (the unit circuits 34a to 34d), and reference is made to the resistance values Ra, Rb, Rc, Rd for the resistance values R of the resistance elements 36a, 36b, 36c, 36d.

Out of the plural driver units 32a to 32d, in the driver circuits 30a to 30d there are driver units 32a to 32d for operation that are connected together in parallel. The overall resistance values Roa to Rod of the respective driver circuits 30a to 30d are accordingly determined by the number of the driver units 32a to 32d for operation, and by the unit resistance values Rxa to Rxd of the respective driver units 32a to 32d.

The driver circuits 30a to 30d are arrayed in parallel in the drive section 26 of the transmission circuit 10, and the outputs of the driver circuits 30a to 30d are combined. The final terminal resistance value (output impedance) Zout that is the output resistance value of the transmission circuit 10 is then an overall value of the overall resistance values Roa to Rod of the driver circuits 30a to 30d. In the transmission circuit 10 the final terminal resistance value Zout is set so as to become the characteristic impedance Zo of the transmission line 16.

The final terminal resistance value Zout functions as an example of a final terminal resistance value of the overall output resistance value of driver circuits in the first exemplary embodiment.

As described above, in each of the driver circuits 30a to 30d the overall resistance values Roa to Rod are set according to weightings W (Wa to Wd). The weightings Wa to Wd employ the inverse ratio of the ratios of the overall resistance values Roa to Rod, such that the overall resistance values Roa to Rod are smaller the larger the numerical values of the weightings Wa to Wd. The transmission circuit 10 sets the unit resistance values Rxa to Rxd of the driver units 32a to 32d in the respective driver circuits 30 based on the weightings Wa to Wd.

The resistance value of the driver units 32 per unit weighting (weighting W=1) is referred to here as resistance value Runit. The unit resistance values Rxa to Rxd of the driver units 32a to 32d are determined by the resistance value Runit and the weightings Wa to Wd. The overall resistance values Roa to Rod of the driver circuits 30a to 30d are determined by the unit resistance values Rxa to Rxd and the number N of the driver units 32a to 32d that are connected in parallel. The final terminal resistance value Zout of the transmission circuit 10 is obtained from the overall resistance values Roa to Rod of the parallel connected driver circuits 30a to 30d. For the final terminal resistance value Zout when there are N individual driver units 32 connected together in parallel in each of the respective driver circuits 30a to 30d, the final terminal resistance value Zout is determined by the resistance value Runit, the weightings Wa to Wd, and the individual number N of the driver units 32. The resistance value Runit is set according to the following Equation (1) from the final terminal resistance value Zout, the weightings Wa to Wd that are the inverse ratio of the ratio of overall resistance values Roa to Rod, and a specific number N. The resistance value Runit functions as an example of a resistance value per unit weighting in the present exemplary embodiment.

$$R\text{unit} = Z\text{out} \cdot (Wa+Wb+Wc+Wd) \cdot N \tag{1}$$

The overall resistance value Ro of the driver circuits 30 in cases in which N individual driver units 32 of unit resistance value Runit are connected together in parallel is obtained according to the following Equation (2).

$$Ro = R\text{unit}/N \tag{2}$$

The overall resistance values Roa, Rob, Roc, Rod of the respective driver circuits 30a to 30d correspond to the weightings Wa to Wd of the driver circuits 30a to 30d, with these being the inverse ratios of the ratios of the overall resistance values Roa to Rod. Consequently, from the Equation (1) and the Equation (2), the overall resistance values Roa to Rod of the driver circuits 30a to 30d are, for example, obtained by computation with the following Equations (3), (4), (5) and (6).

$$Roa = (Wa+Wb+Wc+Wd) \cdot Z\text{out}/Wa \tag{3}$$

$$Rob = (Wa+Wb+Wc+Wd) \cdot Z\text{out}/Wb \tag{4}$$

$$Roc = (Wa+Wb+Wc+Wd) \cdot Z\text{out}/Wc \tag{5}$$

$$Rod = (Wa+Wb+Wc+Wd) \cdot Z\text{out}/Wd \tag{6}$$

Figure 5:
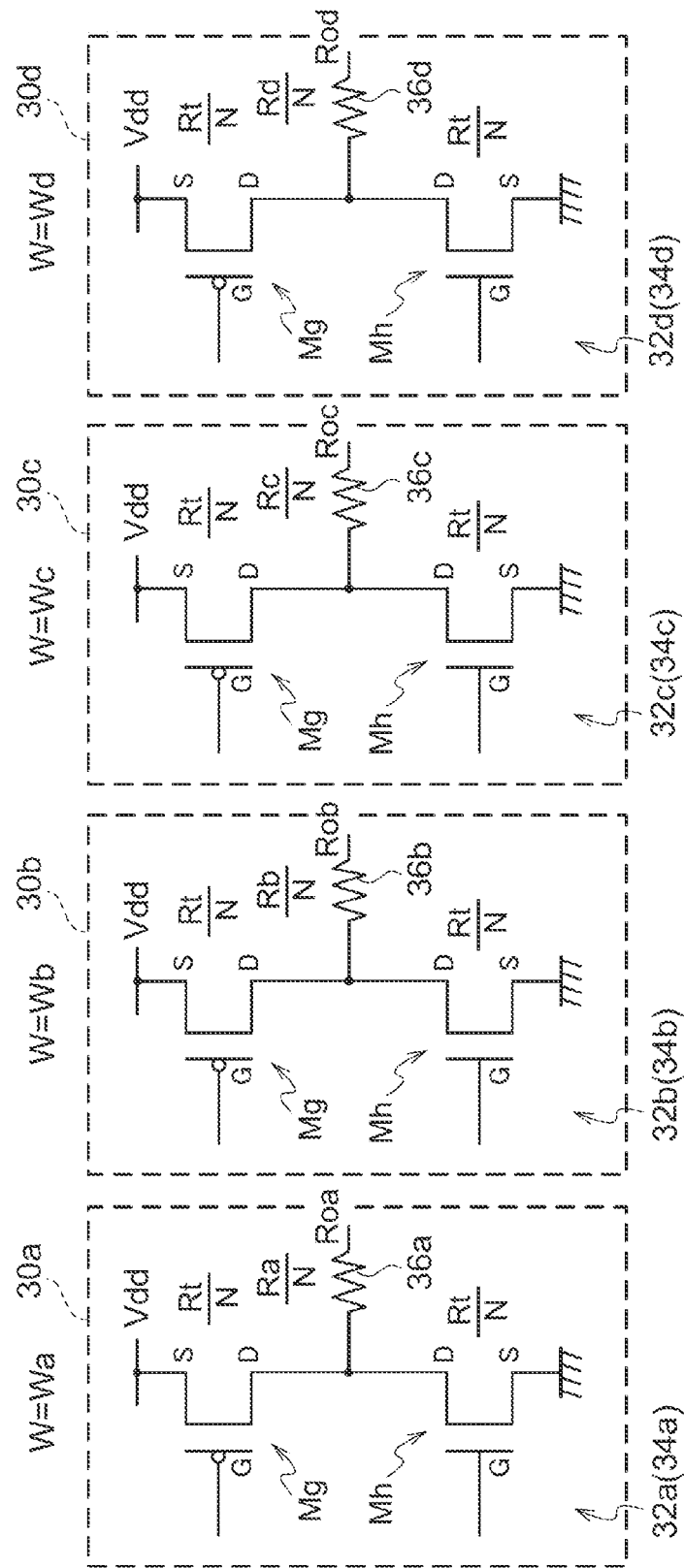
FIG. 5 is a schematic diagram of a driver circuit illustrating a layout of resistance values.

FIG. 5 schematically illustrates resistance values in an example of a case in which there are N individual driver units 32 (32a to 32d) connected together in parallel in the respective driver circuits 30a to 30d. The driver circuit 30a has a resistance value of Ra/N due to N individual resistor elements 36a, the driver circuit 30b has a resistance value of Rb/N due to the N individual resistance elements 36b, the driver circuit 30c has a resistance value of Rc/N due to the N individual resistance elements 36c, and the driver circuit 30d has a resistance value of Rd/N due to the N individual resistance elements 36d.

For example, take a case in which the weightings Wa to Wd are Wa:Wb:Wc:Wd=1:3:10:2, and the final terminal resistance value Zout=Zo=50Ω When N=7, the resistance value Runit is Runit=5600Ω. The overall resistance values Roa to Rod are obtained from the resistance value Runit, with overall resistance value Roa=800Ω, overall resistance value Rob=267Ω, overall resistance value Roc=80Ω, and overall resistance value Rod=400Ω. Note that in the first exemplary embodiment explanation is given wherein the values of weightings Wa to Wd take integer values.

Each of the overall resistance values Roa to Rod are, as illustrated by the computation equations given below, obtained from the unit resistance values Rxa to Rxd of the driver units 32a to 32d and the number N of the driver units 32a to 32d that are connected in parallel.

$$Roa=Rxa/N=(Rt+Ra)/N$$

$$Rob=Rxb/N=(Rt+Rb)/N$$

$$Roc=Rxc/N=(Rt+Rc)/N$$

$$Rod=Rxd/N=(Rt+Rd)/N$$

Consequently, the resistance values Ra to Rd of the resistance elements 36a to 36d provided in the driver units 32a to 32d are set such that Rxa=Roa·N, Rxb=Rob·N, Rxc=Roc·N, Rxd=Rod·N. Note that the method of setting the resistance values R of the resistance element 36 of each of the driver units 32 is not limited thereto.

For transistors, resistor elements and the like formed on the semiconductor integrated circuit 18, sometimes variation arises in the resistance values therein caused by the manufacturing processes. Moreover, in the manufactured semiconductor integrated circuit 18, due for example to fluctuations in temperature and fluctuations in voltage, sometimes variation arises in the resistance values for internally formed transistors, resistor elements and the like. In the transmission circuit 10, the resistance values of the transistors and resistor elements vary to cause characteristic changes.

In the driver circuits 30a to 30d provided to the transmission circuit 10, the overall resistance values Roa to Rod change when there is variation in the resistance value Rt of the transistors Mg, Mh of the driver units 32a to 32d and the resistance values Ra to Rd of the resistance elements 36a to 36d. In the transmission circuit 10, the final terminal resistance value Zout changes due to changing the overall resistance values Roa to Rod of the driver circuits 30a to 30d. Moreover, in the transmission circuit 10, changes in the overall resistance values Roa to Rod appear as changes in the weightings Wa to Wd, which would result in unintentional changes in the electrical characteristics, such that for example it would become difficult to obtain the transmission signal So on which the desired de-emphasis has been performed.

As illustrated in FIG. 1, the adjustment control section 46 therefore respectively outputs the adjustment codes Cca to Ccd to each of the driver circuits 30a to 30d, and controls the operation numbers Na to Nd, these being the number of the driver units 32a to 32d to be operated in each of the driver circuits 30a to 30d. The adjustment control section 46 sets the adjustment codes Cca to Ccd according to the resistance values of the transistors and resistor elements provided in the semiconductor integrated circuit 18 with the driver circuits 30a to 30d. The operation numbers Na to Nd function as an example of the operation number of operation unit circuits in the first exemplary embodiment. In the transmission circuit 10, a number L of the parallel arrayed driver units 32a to 32d in each of the respective driver circuits 30a to 30d is set to be greater than the number of the overall resistance values Roa to Rod to match the final terminal resistance value Zout to the characteristic impedance Zo. For example, in cases in which there are number N of the driver units 32a to 32d to obtain the overall resistance values Roa to Rod to match the final terminal resistance value Zout to the characteristic impedance Zo, the number L of the driver units 32a to 32d is set larger than N (N<L). In the present exemplary embodiment, for example, when transmission circuit 10 is designed with N=8, the number L of the driver units 32a to 32d provided in each of the driver circuits 30a to 30d is set to L=9.

The adjustment control section 46 hence controls the final terminal resistance value Zout of the transmission circuit 10 and the weightings Wa to Wd of the taps a to d by changing the number of the driver units 32a to 32d to operate in each of the driver circuits 30a to 30d using the adjustment codes Cca to Ccd. Note that the number L of the parallel arrayed driver units 32 may, for example, be different between the driver circuits 30a to 30d such that the number L of the driver circuit 30 with the largest numerical value of weighting W is larger than for other driver circuits 30.

As illustrated in FIG. 2, each of the driver units 32 includes a switching circuit 38. The switching circuits 38, as an example, each include a NAND circuit 40, a NOR circuit 42, and an inverter circuit 44. The output terminal of the NAND circuit 40 is connected to the gate G of the transistor Mg of the unit circuit 34 and the output terminal of the NOR circuit 42 is connected to the gate G of the transistor Mh of the unit circuit 34. Signals Sia, Sib, Sic, Sid are respectively input to the NAND circuits 40 and the NOR circuits 42.

The adjustment control section 46 sets the operation numbers Na to Nd for each of the driver circuits 30a to 30d. The adjustment control section 46 outputs to each of the driver circuits 30a to 30d the adjustment codes Cca to Ccd based on the operation numbers Na to Nd. The adjustment codes Cca to Ccd represent data corresponding to the operation numbers Na to Nd in the driver circuits 30a to 30d. Each of the adjustment codes Cca to Ccd, for example, employs binary data including the number of bits corresponding to the number L of the parallel arrayed driver units 32 in the respective driver circuits 30a to 30d.

In each of the driver units 32a to 32d the adjustment codes Cca to Ccd are input to the switching circuit 38. In the switching circuit 38 the adjustment codes Cca to Ccd are input to the NAND circuit 40 and are input through the inverter circuit 44 to the NOR circuit 42. The switching circuit 38 switches over whether or not to input the signals Sia to Sid to the unit circuits 34 by bits of data (1 or 0) corresponding to the adjustment codes Cca to Ccd. The driver units 32a to 32d are operated by the signals Sia to Sid from the switching circuit 38 being input to the unit circuits 34. In each of the driver units 32a to 32d the operating unit circuits 34 are in a parallel connected state. The driver units 32a to 32d stop operation by the signals Sia to Sid not being input from the switching circuit 38 to the unit circuits 34, switching away from being connected in parallel.

Figure 6:
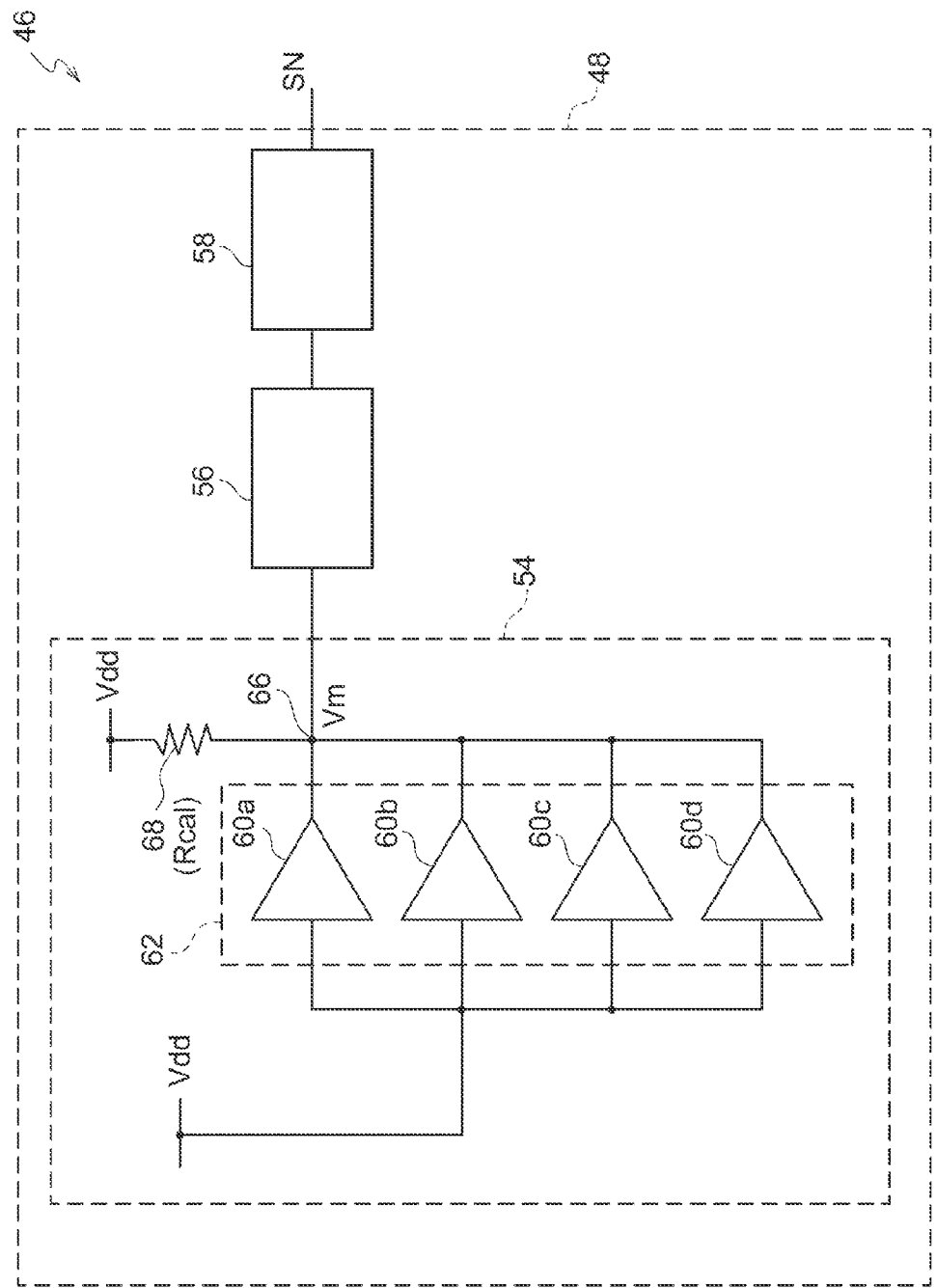
FIG. 6 is a functional block diagram illustrating an example of a basic setting section.

As illustrated in FIG. 1 and FIG. 4, the adjustment control section 46 includes a basic setting section 48, a buffer section 50, and a code setting section 52. The code setting section 52 functions as an example of a setting section of the first exemplary embodiment. FIG. 6 illustrates an example of a basic setting section 48. The basic setting section 48 includes a base voltage detection section 54, a unit resistance computation section 56 and a basic setting section 58. The base voltage detection section 54 functions as an example of a basic detection section of the first exemplary embodiment. The unit resistance computation section 56 functions as an example of a unit resistance computation section in the first exemplary embodiment. The basic setting section 58 functions as an example of a basic setting section in the first exemplary embodiment.

The base voltage detection section 54 includes replica units 60a, 60b, 60c, 60d. The replica unit 60a corresponds to the driver unit 32a of the driver circuit 30a, the replica unit 60b corresponds to the driver unit 32b of the driver circuit 30b, the replica unit 60c corresponds to the driver unit 32c of the driver circuit 30c, the replica unit 60d corresponds to the driver unit 32d of the driver circuit 30d. The replica units 60a to 60d function as an example of plural replication circuits employed in all detection sections in the first exemplary embodiment.

The replica units 60a to 60d correspond to the unit circuits 34a to 34d from which the switching circuit 38 has been removed from the driver units 32a to 32d. In the replica units 60a to 60d, SST using the transistors Mg, Mh and the resistance elements 36a to 36d is formed. Consequently, each of the replica units 60a to 60d functions similarly to each of the unit circuits 34a to 34d of the driver units 32a to 32d.

The base voltage detection section 54 employs the replica units 60a to 60d to form a replica circuit 62 corresponding to each set of the respective driver units 32a to 32d (referred to below as slices) in turn. The replica circuit 62 functions as an example of an overall replica circuit in the first exemplary embodiment. The replica circuit 62 is formed on the semiconductor integrated circuit 18, and hence the output resistance values of the resistance values of the replica units 60a to 60d are affected by manufacturing processes, temperature and pressure similarly to the unit resistance values Rxa to Rxd of the driver units 32a to 32d.

In the base voltage detection section 54 the voltage Vdd is input to each of the replica units 60a to 60d. In the base voltage detection section 54 the output side of each of the replica units 60a to 60d is connected to a node 66.

The base voltage detection section 54 includes a reference resistor element 68 employed for calibration. One end side of the reference resistor element 68 is applied with the voltage Vdd, and the other end thereof is connected to the node 66. The reference resistor element 68 is formed such that a specific resistance value Rcal thereof is fixed and is unaffected by changes in manufacturing processes, changes in temperature or changes in voltage.

In the semiconductor integrated circuit 18, for example, the larger the surface area of the resistor elements, the resistance value of resistor element is less susceptible to changes in manufacturing processes, changes in temperature or changes in voltage. The reference resistor element 68 is accordingly formed to the semiconductor integrated circuit 18 so as to suppress changes of the resistance value Rcal due to changes in manufacturing processes, changes in temperature or changes in voltage. Note that the reference resistor element 68 is not limited to being formed on the semiconductor integrated circuit 18, and may be provided externally to the semiconductor integrated circuit 18.

In the base voltage detection section 54, the transistor Mh in each of the replica units 60a to 60d is switched ON by inputting the voltage Vdd to each of the replica units 60a to 60d. The voltage Vm of the node 66 is a voltage according to the voltage Vdd, and the ratio of the resistance value Rcal of the reference resistor element 68 to the overall resistance value of the output resistance values of the replica units 60a to 60d. The voltage Vm changes according to the resistance values of the transistors Mg, Mh and the resistance values of the resistance elements 36 (36a to 36d) provided to the replica units 60a to 60d.

In the base voltage detection section 54, the voltage Vm is output according to the overall resistance value of the unit resistance values Rxa to Rxd of the driver units 32a to 32d in 1 slice's worth of the driver circuits 30a to 30d. Note that in the base voltage detection section 54, the transistors Mh of the respective replica units 60a to 60d are driven ON, however configuration may be made for example such that the input side of each of the replica units 60a to 60d are connected to ground and the transistors Mg driven ON. Moreover, since it is sufficient in the base voltage detection section 54 to ON drive one or other transistor out of the transistor Mg or the transistor Mh in each of the replica units 60a to 60d, the other transistor out of the transistor Mg or the transistor Mh may be omitted from the replica units 60a to 60d.

Based on the voltage Vm output by the base voltage detection section 54, the unit resistance computation section 56 computes as a resistance value Rslice an overall resistance value according to the resistance value of one slice worth in the respective driver units 32a to 32d. The voltage Vm is a voltage according to the ratio of resistance value Rslice to resistance value Rcal of the reference resistor element 68. The unit resistance computation section 56 may, for example, be formed by employing a logic circuit that implements a general computation equation as represented below. Note that when a logic circuit is employed, analogue-to-digital conversion is performed on the voltage Vm in the unit resistance computation section 56. In the following explanation, rounding processing is performed on the computation results when computation processing is performed using the logic circuit.

$$Rslice = Rcal \cdot Vm/(Vdd-Vm)$$

The basic setting section 58 sets a basic operation number SN based on the resistance value Rslice and the final terminal resistance value Zout required for the transmission circuit 10 (the characteristic impedance Zo of the transmission line 16). The basic operation number SN functions as an example of a basic operation number in the first exemplary embodiment. The basic operation number SN set by the basic setting section 58 is the number of slices required to match the final terminal resistance value Zout of the transmission circuit 10 to the characteristic impedance Zo, and is the same number as the operation number of the driver units 32a to 32d in the driver circuits 30a to 30d. The drive section 26 operates SN slices of the driver units 32a to 32d, such that the output resistance value is the overall value of SN individual resistances of resistance value Rslice connected together in parallel. The basic setting section 58 may, for example, be formed by employing a logic circuit that executes the following computation equation based on the Equation (2). Note that integer values are employed for the basic operation number SN, however it is not always necessary to employ integers since in the first exemplary embodiment correction processing is performed on the basic operation number SN.

$$SN = Rslice/Zout$$

As illustrated in FIG. 1 and FIG. 4, the basic setting section 48 is connected to the buffer section 50. The buffer section 50 is connected to the code setting section 52. The buffer section 50 reads and holds the basic operation number SN set by the basic setting section 58 of the basic setting section 48. The code setting section 52 employs the basic operation number SN held by the buffer section 50 and sets the operation numbers Na to Nd for each of the driver circuits 30a to 30d.

The basic operation number SN enables the final terminal resistance value Zout of the transmission circuit 10 to be matched to the characteristic impedance Zo of the transmission line 16 by operating the basic operation number SN of the driver units 32a to 32d in the respective driver circuits 30a to 30d. However, the basic operation number SN does not always make the resistance values of the driver circuits 30a to 30d the overall resistance values Roa to Rod according to the weightings Wa to Wd. The code setting section 52 computes a weighting for at least one of the driver circuits 30, and then employs the computed weighting, the pre-set weightings Wa to Wd and the basic operation number SN to set the operation numbers Na to Nd for the driver circuits 30a to 30d.

Figure 7:
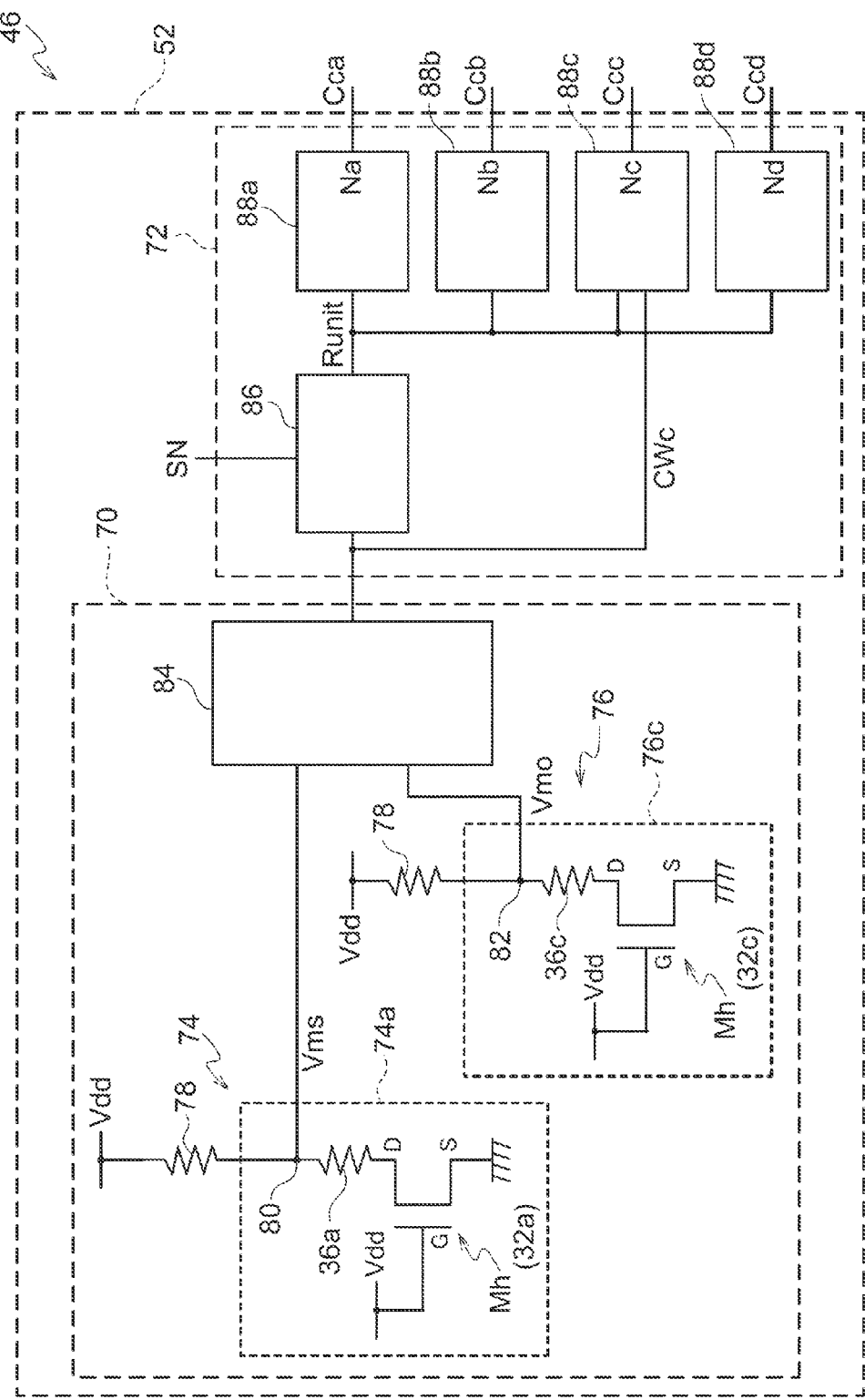
FIG. 7 is a functional block diagram illustrating an example of a code setting section according to a first exemplary embodiment.

FIG. 7 illustrates an example of a code setting section 52. The code setting section 52 includes a weighting setting section 70 and an operation number setting section 72. The weighting setting section 70 includes a reference detection section 74, a target detection section 76, and a weighting computation section 84. The reference detection section 74 and the target detection section 76 function as an example of an individual detection section in the first exemplary embodiment. The weighting computation section 84 functions as an example of a resistance ratio computation section in the first exemplary embodiment. The weighting setting section 70 is associated with at least 2 of the driver circuits 30 out of the driver circuits 30a to 30d of the tap a to tap d. The weighting setting section 70 uses one driver circuit 30 of the two driver circuits 30 as a reference and the other driver circuit 30 as a calibration target, and then computes a weighting of a calibration target driver circuit 30 with respect to a reference driver circuit 30. The weighting setting section 70 sets the computed weighting as the weighting of the calibration target driver circuit 30. The reference detection section 74 corresponds to the driver units 32 provided in the driver circuit 30 of the reference tap, and the target detection section 76 corresponds to the driver units 32 of the driver circuit 30 of the calibration target tap.

The driver circuit 30 of the reference tap and the driver circuit 30 of the calibration target tap are set to given taps out of the taps a to d. Preferably the driver circuit 30 employed as a reference is the driver circuit 30a of the tap with the largest overall resistance value Ro set according to weighting (for example the tap a of weighting Wa=1).

For the driver circuit 30 of the calibration target tap, a simulation may for example be performed of operation of the transmission circuit 10 formed to the semiconductor integrated circuit 18, and the calibration target driver circuit 30 set based on results of the simulation. From the simulation results, the driver circuit 30 of the calibration target tap may, for example, be applied to the driver circuit 30 in which a change in the weighting W has occurred, or to the driver circuit 30 in which the greatest change in the weighting W has occurred. Moreover, the driver circuit 30 of the calibration target tap may be applied to the driver circuit 30c of the tap where the smallest overall resistance values Ro is set according to weighting (for example the tap c of weighting Wc=10).

FIG. 7 illustrates an example in which the driver circuit 30a of the tap a is applied as the reference, and the driver circuit 30c of the tap c is applied as the calibration target. In the semiconductor integrated circuit 18, the reference detection section 74 is formed corresponding to the driver circuit 30a of the reference tap by pre-setting the reference tap and the calibration target tap. In the semiconductor integrated circuit 18 the target detection section 76 is formed corresponding to the driver circuit 30c of the calibration target tap.

The reference detection section 74 is provided with a replica circuit 74a that includes a transistor and resistor element corresponding to the driver units 32a (the unit circuit 34a) of the tap a (referred to below as the transistor Mh and the resistor element 36a). The target detection section 76 is provided with a replica circuit 76c that includes a transistor and resistor element corresponding to respective the driver units 32c (the unit circuit 34c) of the tap c (referred to below as the transistor Mh and the resistor element 36c). The reference detection section 74 and the target detection section 76 include a resistor element 78 with a specific resistance value. The replica circuits 74a, 76c function as an example of replica circuits employed in the individual detection section of the first exemplary embodiment. Note that the replica circuit 74a and the replica circuit 76c may be formed by employing the transistor Mg in place of the transistor Mh.

In the replica circuit 74a of the reference detection section 74, the voltage Vdd is applied to the drain D of the transistor Mh through the resistor element 36a and the resistor element 78, and the voltage Vdd is input to the gate G of the transistor Mh. In the replica circuit 76c of the target detection section 76, the voltage Vdd is applied to the drain D of the transistor Mh through the resistor element 36c and the resistor element 78, and the voltage Vdd is input to the gate G of the transistor Mh.

The reference detection section 74 outputs, from a node 80 that is a connection point between the resistor element 36a and the resistor element 78, a voltage Vms corresponding to the ratio of the resistance value (overall resistance value) of the transistor Mh and the resistor element 36a and the resistance value of the resistor element 78. The target detection section 76 outputs, from a node 82 that is a connection point between the resistor element 36c and the resistor element 78, a voltage Vmo corresponding to the ratio of the resistance value (overall resistance value) of the transistor Mh and the resistor element 36c and the resistance value of the resistor element 78.

The voltage Vms corresponds to the ratio between an actual unit resistance value Rxam of the driver unit 32a and the resistance value of the resistor element 78. The voltage Vmo corresponds to the ratio of an actual unit resistance value Rxcm of the driver unit 32c and the resistance value of the resistor element 78. Consequently, the ratio of the voltage Vmo with respect to the voltage Vms is the ratio of the weighting of the driver circuit 30a and the weighting of the driver circuit 30c. By forming the replica circuits 74a, 76c to the semiconductor integrated circuit 18, the output resistance values are also affected by the manufacturing processes, temperature and voltage similarly to the unit resistance values Rxa, Rxc that are the output resistance values of the driver units 32a, 32c.

The weighting computation section 84 computes the ratio of the weighting W of the calibration target tap (tap c) with respect to the weighting W of the reference tap (tap a), based on the voltages Vms, Vmo. The weighting computation section 84 computes the weighting W (CWc) of the calibration target tap (tap c) based on the computed weighting W ratio, and on the weighting W(Wa) of the reference tap (tap a). The similar voltage Vdd and resistor element 78 are employed across the reference detection section 74 and the target detection section 76, and so the ratio of the voltage Vms and the voltage Vmo is the ratio for the actual unit resistance values Rxam and Rxcm. The weighting W uses an inverse ratio to the ratio of the overall resistance values Ro. Consequently, the weighting Wc of the calibration target driver circuit 30c (the calibrated weighting CWc) is obtained from the weighting Wa for the reference driver circuit 30a and the voltages Vmo, Vms using a general computation equation. The weighting computation section 84 may, for example, be formed using a logic circuit that executes the following computation equation.

$$CWc = Wa \cdot Vms(Vdd - Vmo)/Vmo(Vdd - Vms).$$

The operation number setting section 72 includes a unit setting section 86 and individual setting sections 88a, 88b, 88c, 88d corresponding to each of the taps a to d. The unit setting section 86 functions as an example of a resistance setting section of the first exemplary embodiment. The individual setting sections 88a to 88d function as an example of individual setting sections of the first exemplary embodiment.

The unit setting section 86 sets the resistance value Runit per unit weighting (W=1) of the driver unit 32. In setting the resistance value Runit, the unit setting section 86 employs the weighting CWc corresponding to the calibration target tap c (the driver circuit 30c) computed by the weighting computation section 84 and the weightings Wa, Wb, Wd pre-set for each of the taps a, b, d other than the calibration target tap c. In setting the resistance value Runit, the unit setting section 86 employs the basic operation number SN held in the buffer section 50 (see FIG. 1 and FIG. 4), and the final terminal resistance value Zout (or the target characteristic impedance Zo).

To set the resistance value Runit in the unit setting section 86 a logic circuit may for example be employed to execute the following computation equation based on Equation (1).

$$Runit = Zout \cdot (Wa + Wb + CWc + Wd) \cdot SN$$

The individual setting section 88a sets the operation number Na for the driver circuit 30a of the tap a and outputs the adjustment code Cca based on the set operation number Na. The individual setting section 88b sets the operation number Nb for the driver circuit 30b of the tap b and outputs the adjustment code Ccb based on the set operation number Nb. The individual setting section 88c sets the operation number Nc for the driver circuit 30c of the tap c and outputs the adjustment code Ccc based on the set operation number Nc. The individual setting section 88d sets the operation number Nd for the driver circuit 30d of the tap d and outputs the adjustment code Ccd based on the set operation number Nd.

To set the operation numbers Na to Nd, the individual setting sections 88a to 88d employ the resistance value Runit, the weightings Wa to Wd for each of the taps a to d, and the pre-set overall resistance values Roa, Rob, Roc, Rod of the driver circuits 30a to 30d. When this is performed, the individual setting sections 88a, 88b, 88d corresponding to taps other than the calibration target tap (taps a, b, d) employ pre-set weightings Wa, Wb, Wd. The individual setting section 88c corresponding to the calibration target tap (tap c) employs a computed weighting CWc in the weighting computation section 84.

Each of the individual setting sections 88a to 88d may, for example, be configured using a logic circuit that implements the following computation equations, based on the Equation (1) to Equation (6).

$$Na = Runit/(Roa \cdot Wa)$$

$$Nb = Runit/(Rob \cdot Wb)$$

$$Nc = Runit/(Roc \cdot CWc)$$

$$Nd = Runit/(Rod \cdot Wd)$$

The individual setting sections 88a to 88d perform specific rounding processing (such as for example nearest rounding) on the computation results of the operation numbers Na to Nd, and sets the operation numbers Na to Nd to positive integer values. The individual setting sections 88a to 88d convert the operation numbers Na to Nd into binary data (the adjustment codes Cca to Ccd) and output the binary data.

The operation numbers Na to Nd set by the individual setting sections 88a to 88d correspond to the numbers of the driver units 32a to 32d to operate in the driver circuits 30a to 30d. The individual setting sections 88a to 88d employ the resistance value Runit set based on the basic operation number SN, and the operation numbers Na to Nd are corrected values of the basic operation number SN for the driver circuits 30a to 30d.

As illustrated in FIG. 1, the adjustment codes Cca to Ccd are input to the respective driver circuits 30a to 30d. In the driver circuits 30a to 30d, each of the switching circuits 38 provided in the driver units 32a to 32d are input with the respective adjustment code Cca to Ccd, and a number of the driver units 32a to 32d corresponding to the adjustment codes Cca to Ccd are operated.

Explanation follows regarding operation of the first exemplary embodiment.

In the transmission circuit 10 the driver circuits 30a to 30d are formed based on the weightings Wa to Wd set in each of the taps a to d. Simulation is performed of operation of the transmission circuit 10 prior to manufacture of the semiconductor integrated circuit 18 in which the transmission circuit 10 is provided. In the simulation of the operation of the transmission circuit 10, for example, determination is made as to whether or not there are changes to the weightings Wa to Wd of the taps a to d caused by manufacturing processes.

Figure 8A:
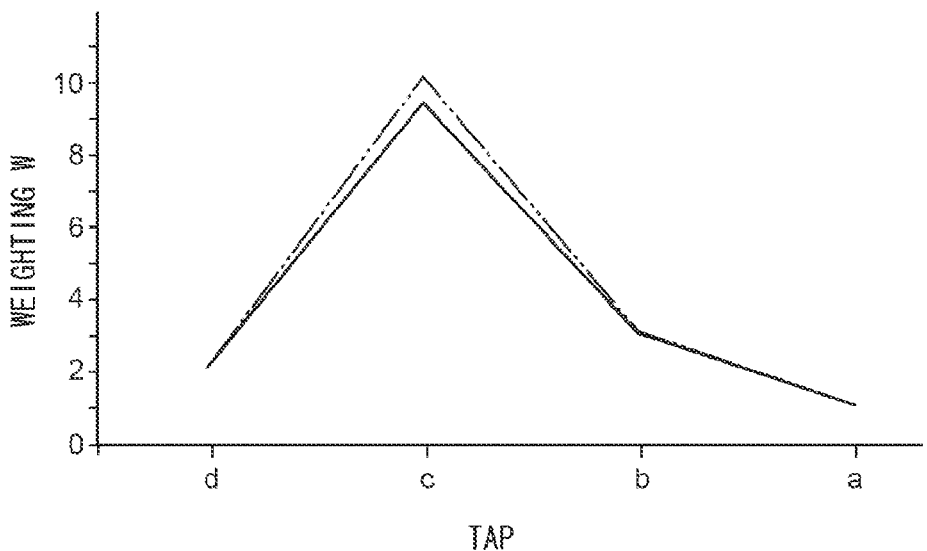
FIG. 8A and FIG. 8B are line graphs illustrating theoretical values and simulation values of weightings for respective taps.
Figure 8B:
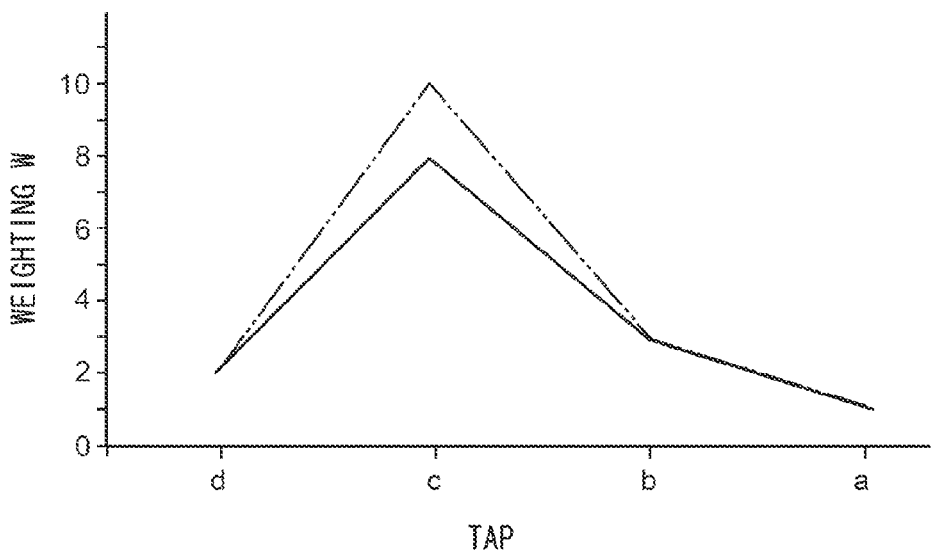

FIG. 8A to FIG. 8B illustrate examples of simulation results when the weightings Wa, Wb, Wc, Wd of the taps a to d are Wa:Wb:Wc:Wd=1:3:10:2. Note that the simulation results are illustrated with solid lines in FIG. 8A and FIG. 8B, and theoretical values (design values) are illustrated by the double-dot intermittent lines.

FIG. 8A illustrates the weightings Wb to Wd of the taps b to d under standard conditions with weighting Wa of the tap a=1. In the transmission circuit 10 of the semiconductor integrated circuit 18, under standard conditions the relative value of the weighting W of one of the taps a to d sometimes changes. In particular, by employing the inverse ratio of the ratio of the overall resistance values Roa to Rod as the weightings W, a change in the weighting readily occurs in the tap with the largest numerical value of weighting W, with a small overall resistance values Ro of the driver circuit 30.

The transistor and resistor element forming the semiconductor integrated circuit 18 have different characteristics of operation speed caused by factors such as manufacturing processes to the characteristics at the design stage, and resistance values of transistors and resistance values or resistor elements are changed by differences in characteristics such as operation speed. FIG. 8B illustrates a simulation results in which under conditions of raised temperature a transistor formed region operates slower than design, and a resistor element formed region operates faster than design.

In the transmission circuit 10 of the semiconductor integrated circuit 18, there are sometimes changes in the relative values of one or other of the weightings W of taps a to d due to operation speed characteristic or temperature. The calibration target tap is, for example set as the tap c when in simulation the weighting of tap c exhibits a change. The reference tap is, for example, set as the tap a when this is the tap with the smallest numerical value of weighting W and is the tap set with the largest overall resistance value Ro.

By the code setting section 52 of the adjustment control section 46 making the tap c the calibration target, the replica circuit 76c is formed corresponding to the driver unit 32c of the driver circuit 30c of the tap c in the target detection section 76 of the weighting setting section 70. By the code setting section 52 setting tap a as the reference, the replica circuit 74a corresponding to the driver unit 32a of the driver circuit 30a of the tap a is formed in the reference detection section 74 of the weighting setting section 70. The weighting setting section 70 computes the weighting CWc of the tap c using the weighting Wa of the tap a as the reference.

The unit setting section 86 of the code setting section 52 is formed so as to set a resistance value Runit employing the weighting CWc computed by the weighting setting section 70 in place of the pre-set weighting Wc of the tap c. Moreover, the individual setting section 88c of the code setting section 52 is formed so as to set the adjustment code Ccc using the weighting CWc.

Consequently, the semiconductor integrated circuit 18 is produced with the transmission circuit 10 formed containing the adjustment control section 46 with the tap a acting as a reference and the tap c acting as the calibration target. In the transmission circuit 10 of the produced semiconductor integrated circuit 18, the adjustment control section 46 is for example operated by start of supply of power when the semiconductor integrated circuit 18 is connected to a power supply. The adjustment control section 46 sets the operation numbers Na to Nd of the driver units 32a to 32d of the driver circuits 30a to 30d to operate, and based on the set operation numbers Na to Nd, respectively outputs the adjustment codes Cca to Ccd to each of the driver circuits 30a to 30d.

In the adjustment control section 46, the unit resistance computation section 56 computes the resistance value Rslice that is the overall value of the output resistance value of one slice's worth of the driver units 32a to 32d based on the voltage Vm output from the replica circuit 62. The basic setting section 58 employs the resistance value Rslice, and sets the basic operation number SN to make the final terminal resistance value Zout from the current resistance value Rt of the transistors Mg, Mh and the resistance values Ra to Rd of the resistance elements 36a to 36d the characteristic impedance Zo.

Consequently, when making the final terminal resistance value Zout to be characteristic impedance Zo, the basic operation number SN is the numerical value that at least makes the final terminal resistance value Zout of the transmission circuit 10 be the characteristic impedance Zo. However, in the transmission circuit 10, the relative values of the weightings W between the taps a to d change, and there are changes in the electrical properties as the FFE due to the changes in the weightings W.

The code setting section 52 of the adjustment control section 46 sets the operation numbers Na to Nd for each of the driver circuits 30a to 30d, including the actual weighting CWc of the calibration target tap c and the basic operation number SN. The weighting setting section 70 of the code setting section 52 computes the weighting CWc of the tap c with the weighting Wa of the tap a as a reference from the voltage Vms output from the reference detection section 74, and from the voltage Vmo output from the target detection section 76.

The unit setting section 86 of the code setting section 52 employs the basic operation number SN set by the basic setting section 48, the weightings Wa, Wb, Wd of the taps a, b, d other than the calibration target tap, and the weighting CWc of the calibration target tap c to set the resistance value Runit. The individual setting sections 88a to 88d set the operation numbers Na to Nd for the driver circuits 30a to 30d of the taps a to d.

For example, in a case in which the voltage Vdd is 0.8V (Vdd=0.8V), the voltage Vms of the reference detection section 74 is 0.229V (Vms=0.229V), and the voltage of the target detection section 76 is 0.618V (Vmo=0.618V), the weighting CWc computed in the weighting computation section 84 is 8.2 (CWc=8.2). Moreover, when the basic operation number SN is 8 (SN=8), the resistance value Runit set in the unit setting section 86 is 5680Ω (Runit=5680).

Based on the resistance value Runit, the individual setting section 88a sets the operation number Na for the driver circuit 30a of the tap a to 7 (Na=7), and based on the resistance value Runit, the individual setting section 88b sets the operation number Nb for the driver circuit 30b of the tap b to 7 (Nb=7). Based on the resistance value Runit, the individual setting section 88d sets the operation number Nd for the driver circuit 30d of the tap d to 7 (Nd=7). Moreover, based on the resistance value Runit, the individual setting section 88c sets the operation number Nc for the driver circuit 30c of the tap c to 9 (Nc=9).

Consequently, the adjustment codes Cca to Ccd matching the actual resistance value Rt of the transistors Mg, Mh on the semiconductor integrated circuit 18 and the resistance values Ra to Rd of the resistance elements 36a to 36d are input to the driver circuits 30a to 30d.

The driver circuits 30a to 30d use the adjustment codes Cca to Ccd to switch operation/non-operation of each of the driver units 32a to 32d, and the driver units 32a to 32d of the operation numbers Na to Nd are operated. Consequently, the transmission circuit 10 operates in a matched state of the final terminal resistance value Zout to the characteristic impedance Zo, and with the relative weighting W between the taps a to d maintained at the pre-set weightings Wa to Wd. The weightings Wa to Wd employ the inverse ratio of the ratio of the overall resistance values Roa to Rod of the driver circuits 30a to 30d, and driver circuits 30a to 30d are adjusted to the pre-set overall resistance values Roa to Rod.

Comparative Example

Figure 9:
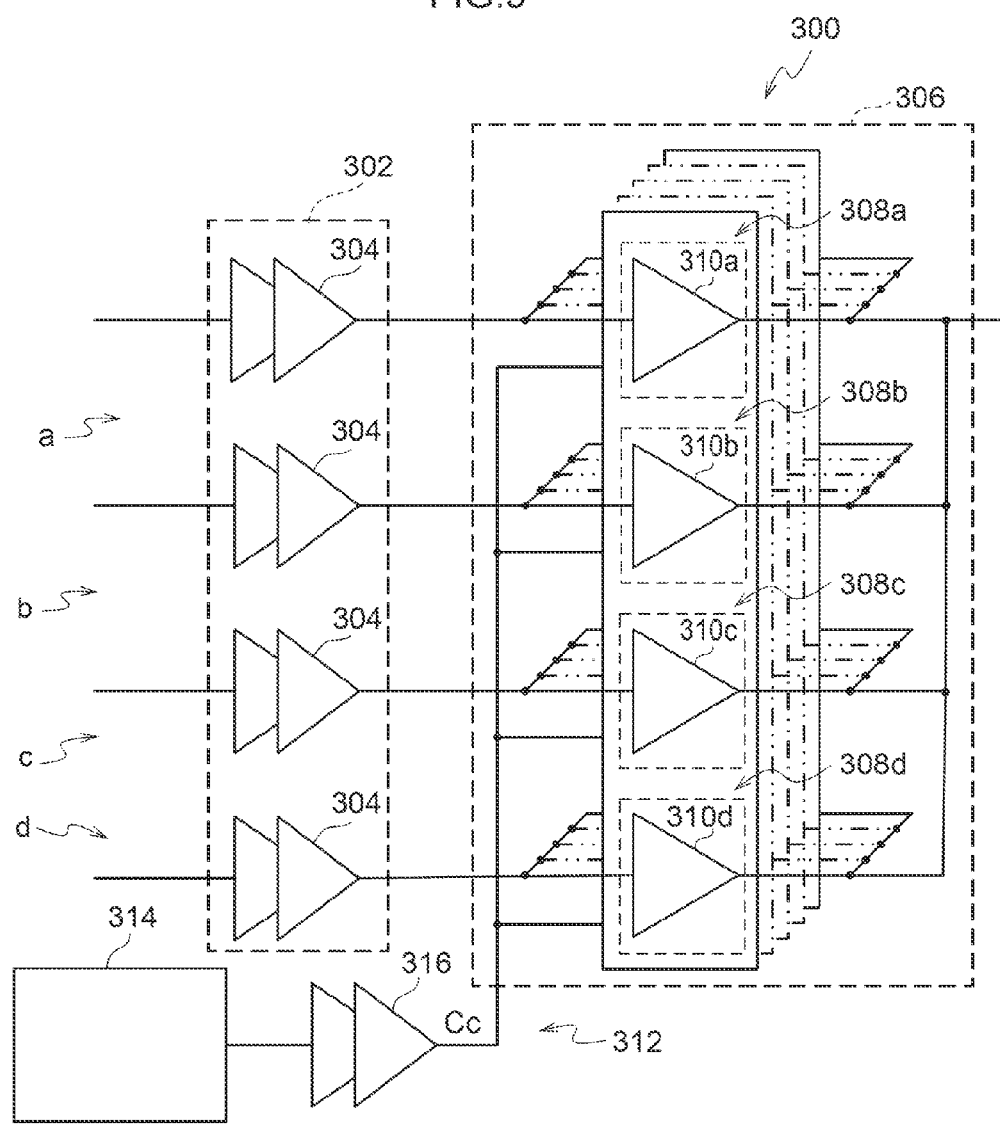
FIG. 9 is a functional block diagram illustrating a transmission circuit of a Comparative Example to the first exemplary embodiment.

FIG. 9 illustrates a transmission circuit 300 of a Comparative Example to the first exemplary embodiment. The transmission circuit 300 function as an FFE with 4 taps (tap a to d). In the transmission circuit 300, a pre-driver section 302 corresponding to the pre-driver section 24 includes pre-driver circuits 304 corresponding to the pre-driver circuits 28. The transmission circuit 300 includes a drive section 306 corresponding to the drive section 26 and driver circuits 308a to 308d corresponding to the driver circuits 30a to 30d. The driver circuits 308a to 308d include plural driver units 310a to 310d corresponding to the driver units 32a to 32d. The transmission circuit 300 includes an adjustment control section 312, and the adjustment control section 312 includes a basic setting section 314 and a buffer section 316.

The basic setting section 314 is equipped with functionality corresponding to the basic setting section 48, and outputs a basic operation number SN for matching the final terminal resistance value of the transmission circuit 300 to a characteristic impedance of the transmission path. The buffer section 316 stores an adjustment code Cc based on the basic operation number SN, and outputs the stored adjustment code Cc to each of the driver circuits 308a to 308d. Thus in the driver circuits 308a to 308d of the transmission circuit 300, the same number of the driver units 310a to 310d are thereby operated based on the same adjustment code Cc. In the driver circuits 308a to 308d the operation number of the driver units 310a to 310d are set in so-called slice units.

Figure 10:
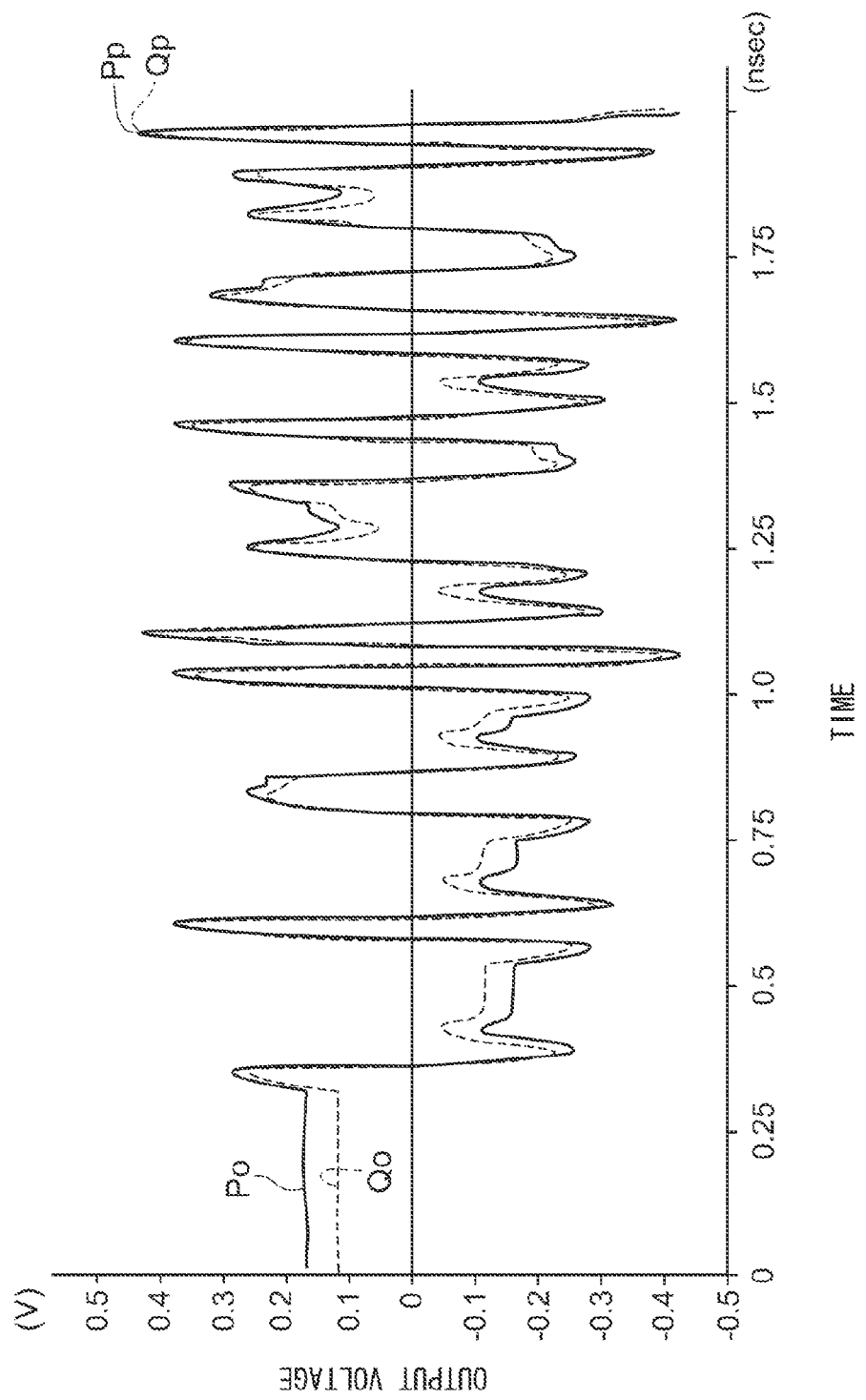
FIG. 10 is a line graph illustrating an example of an output voltage waveform.

FIG. 10 illustrates by a solid line an example of the voltage waveform output as transmission signal So by the transmission circuit 10 of the first exemplary embodiment, and illustrates by a broken line the voltage waveform output by a transmission circuit 300 according to a Comparative Example. Note that the transmission circuit 10 and the transmission circuit 300 are designed such that the peak voltage is 8.5 dB (theoretical value) for the voltage output when the input signal Si is 0V (direct current) (the voltage corresponding to the point $P_0$, $Q_0$ in FIG. 10).

Since generally a permissible range of amplitude of a voltage waveform is ±1 dB with respect to the theoretical value, in the transmission circuit 10 and the transmission circuit 300, preferably the peak voltage with reference to an input signal Si=0 v is 8.5 dB±1 dB. In the transmission circuit 300, when the input signal Si is 0 v (point $Q_0$) the output voltage is 0.12V, and the peak voltage (point Qp) is 0.43 v. Consequently, in the transmission circuit 300 the ratio of peak voltage is 11.3 dB, exhibiting a large deviation from the theoretical value permitted range.

In contrast thereto, in the transmission circuit 10 the peak voltage (point Pp) is 0.43 v, and the output voltage when the input signal Si is 0 v (point $P_0$) is 0.17 v. Thus in the transmission circuit 10, the ratio of the peak voltage at 8.3 dB is close to the theoretical value 8.5 dB, thereby satisfying the required circuit characteristics.

The adjustment control section 46 of the transmission circuit 10 computes the weighting CWc of tap c set as the calibration target, and individually sets the operation numbers Na to Nd of the driver units 32a to 32d for the driver circuits 30a to 30d based on the computed weighting CWc. When power supply is started to the semiconductor integrated circuit 18, the adjustment control section 46 sets the operation numbers Na to Nd of the driver units 32a to 32d for the driver circuits 30a to 30d prior to operation of the transmission circuit 10.

The transmission circuit 10 is accordingly capable of outputting the transmission signal So with the desired voltage waveform even though there are fluctuations in resistance values such as in the resistance elements 36 due to changes in manufacturing processes, fluctuations in temperature or voltage fluctuation. Moreover, the transmission circuit 10 is also able to perform an appropriate degree of de-emphasis, and able to output the transmission signal So capable of being appropriately decoded by the reception circuit 14.

In the first exemplary embodiment explained above, the calibration target tap is set based on simulation results performed prior to manufacturing the semiconductor integrated circuit 18, however, without performing simulation, calibration may be performed on the weighting W of one or other of the taps in advance.

In such cases, the tap set as the calibration target may, for example, apply to the tap with the largest numerical value of weighting W between the plural taps. The tap with the largest numerical value of the weighting W has the smallest overall resistance value Ro, and the weighting W thereof is liable to change due to changes in resistance value. The reference tap is preferably set as the tap with the smallest numerical value of the weighting W, this being the tap with the largest overall resistance value Ro. Adopting this approach in the transmission circuit 10 enables changes in the relationship weightings between the taps a to d to be controlled at high precision. The transmission circuit 10 is thereby able to suppress changes in the circuit properties even though changes occur in the resistance value of the transistors Mg, Mh and the resistance elements 36 caused by changes in the manufacturing processes, temperature and voltage.

In the first exemplary embodiment, the weighting W of the inverse ratio of the ratio of the output resistance values is employed as the ratio based on the output resistance values of the driver circuits, however there is no limitation thereto, and the ratio of output resistance values may be employed therefor. Moreover, although in the first exemplary embodiment a single tap out of the plural taps a to d is set as the calibration target, there is no limitation thereto, and 2 or more taps maybe set as calibration targets.

Second Exemplary Embodiment

Detailed explanation follows regarding a second exemplary embodiment of technology disclosed herein. Note that since basic configuration of the second exemplary embodiment is similar to that of the first exemplary embodiment, the same reference numerals are allocated in the second exemplary embodiment to similar functional components to those of the first exemplary embodiment, and further explanation is omitted thereof.

Figure 11:
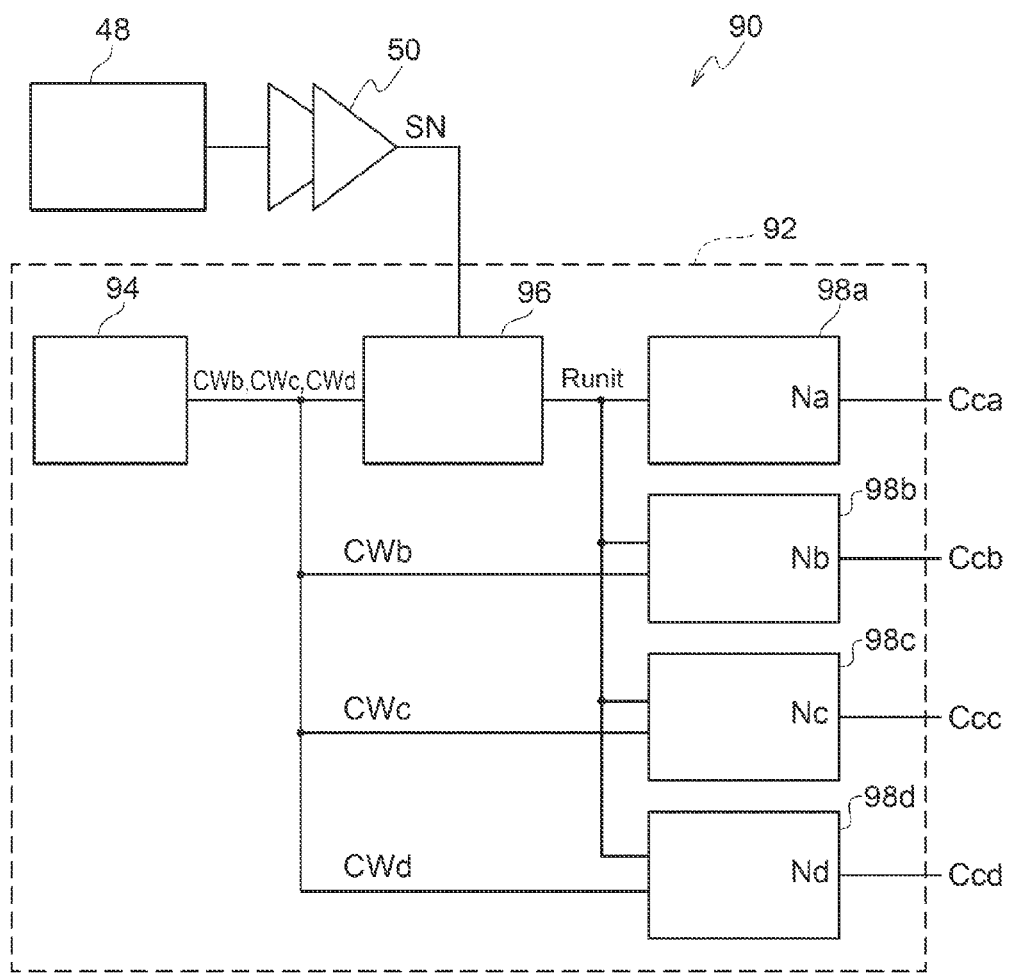
FIG. 11 is a functional block diagram of an adjustment control section according to a second exemplary embodiment.

FIG. 11 illustrates an adjustment control section 90 according to the second exemplary embodiment. The adjustment control section 90 is employed in place of the adjustment control section 46 according to the first exemplary embodiment. The adjustment control section 90 includes a basic setting section 48, a buffer section 50, and a code setting section 92. The code setting section 92 is employed in place of the code setting section 52 according to the first exemplary embodiment. The code setting section 92 functions as an example of a setting section in the second exemplary embodiment.

The code setting section 92 includes a weighting setting section 94, a unit setting section 96, and individual setting sections 98a, 98b, 98c, 98d. The unit setting section 96 functions as an example of a resistance value setting section according to the second exemplary embodiment, and the individual setting sections 98a to 98d function as an example of individual setting sections of the second exemplary embodiment.

Figure 12:
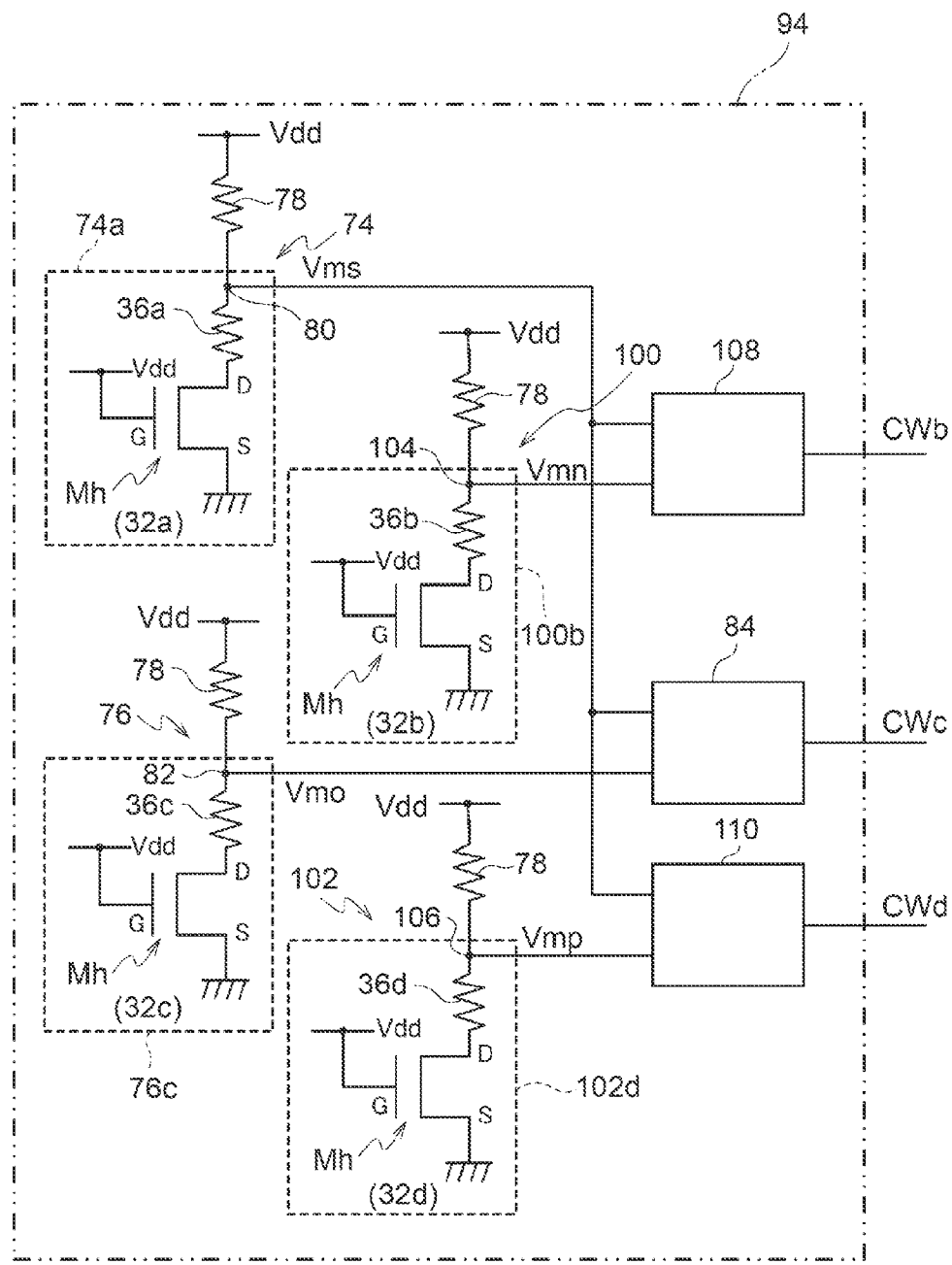
FIG. 12 is a functional block diagram illustrating an example of a weighting setting section according to the second exemplary embodiment.

FIG. 12 illustrates the weighting setting section 94. The weighting setting section 94 includes a reference detection section 74 corresponding to one tap (tap a) out of plural taps a to d, and target detection sections 100, 76, 102 corresponding to each of the other taps (taps b, c, d). Namely, the weighting setting section 94 has the taps b, c, d as calibration targets with the tap a as the reference. The reference detection section 74 and the target detection sections 76, 100, 102 function as an example of individual detection sections in the second exemplary embodiment.

The target detection section 100 corresponds to the driver circuit 30b of the tap b and the target detection section 102 corresponds to the driver circuit 30d of the tap d, and the basic configuration of the target detection sections 100, 102 is similar to that of the target detection section 76. The target detection section 100 is equipped with a replica circuit 100b that includes a transistor Mh and a resistance element 36b corresponding to the driver unit 32b (the unit circuit 34b). The target detection section 102 is equipped with a replica circuit 102d that includes a transistor Mh and a resistance element 36d corresponding to the driver unit 32d (the unit circuit 34d).

Thus the target detection section 100 outputs from a node 104 that is at the connection point between the resistance element 36b and the resistor element 78, a voltage Vmn based on the resistance value according to a resistance value of the resistor element 78 and a resistance value Rxb of the driver unit 32b. The target detection section 102 outputs from a node 106 that is at the connection point between the resistance element 36d and the resistor element 78, a voltage Vmp based on the resistance value according to a resistance value of the resistor element 78 and an output resistance value of the driver unit 32d.

The weighting setting section 94 includes an weighting computation section 84 corresponding to the tap c, a weighting computation section 108 corresponding to the tap b, and a weighting computation section 110 corresponding to the tap d. A voltage Vms of the reference detection section 74 and the voltage Vmn of the target detection section 100 are input to the weighting computation section 108. Based on the voltages Vms and Vmn, the weighting computation section 108 computes a weighting CWb for the tap b with the weighting Wa of the tap a as a reference. The voltage Vms of the reference detection section 74 and the voltage Vmp of the target detection section 102 are input to the weighting computation section 110. Based on the voltages Vms and Vmp, the weighting computation section 110 computes a weighting CWd for the tap d with the weighting Wa of the tap a as a reference.

Each of the weighting computation section 108 employed to compute the weighting CWb, and the weighting computation section 110 employed to compute the weighting CWd may, similarly to the weighting computation section 84, be formed for example by a logic circuit that executes the following computation equations.

$$CWb=Wa \cdot Vms(Vdd-Vmn)/Vmn(Vdd-Vms)$$

$$CWd=Wa \cdot Vms(Vdd-Vmp)/Vmp(Vdd-Vms)$$

As illustrated in FIG. 11, the weightings CWb, CWc, Cwd computed by the weighting setting section 94 are input to the unit setting section 96. The unit setting section 96 performs setting of the weighting Wa of the tap a, the weighting CWb corresponding to the tap b, the weighting CWc corresponding to the weighting CWc, the weighting CWd corresponding to the tap d, and setting of the resistance value Runit from the basic operation number SN set by the basic setting section 48

To set the resistance value Runit in the unit setting section 96, a logic circuit may for example be employed that executes the following computational equation based on Equation (1).

$$Runit=Zout \cdot (Wa+CWb+CWc+CWd) \cdot SN$$

The individual setting section 98a operates similarly to the individual setting section 88a and sets the operation number Na for the driver unit 32a of the driver circuit 30a. The individual setting section 98c operates similarly to the individual setting section 88c and sets the operation number Nc for the driver unit 32c of the driver circuit 30c.

The individual setting section 98b sets the operation number Nb for the driver unit 32b of the driver circuit 30b based on the resistance value Runit, the weighting CWb for the tap b, and the overall resistance value Rob of the driver circuit 30b corresponding to the tap b. The individual setting section 98d sets the operation number Nd for the driver unit 32d of the driver circuit 30d based on the resistance value Runit, the weighting CWd for the tap d, and the overall resistance value Rod of the driver circuit 30d corresponding to the tap d.

Each of the individual setting sections 98a to 98d may, for example, be formed with a logic circuit that executes the following computational equations based on Equations (1) to (6).

$$Na=Runit/(Roa \cdot Wa)$$

$$Nb=Runit/(Rob \cdot CWb)$$

$$Nc=Runit/(Roc \cdot CWc)$$

$$Nd=Runit/(Rod \cdot CWd)$$

The individual setting sections 98a to 98d output the adjustment codes Cca to Ccd according to the set operation numbers Na to Nd. The code setting section 92 is accordingly capable of performing appropriate weighting between the taps a to d even when there are changes in the resistance value Rt of the transistors Mg, Mh of the driver units 32a to 32d or the resistance value Ra to Rd of the resistance elements 36a to 36d. The code setting section 92 takes one tap as the reference tap, and sets the weighting W of all the taps other than the reference tap, thereby enabling the errors in weightings causes by changes in resistance values to be suppressed with high precision.

The transmission circuit 10 provided with the adjustment control section 90 operates with the operation numbers Na to Nd of the driver units 32a to 32d based on the adjustment codes Cca to Ccd output from the code setting section 92. Consequently, the transmission circuit 10 provided with the adjustment control section 90 does not suffer deterioration in the de-emphasis effect even when changes arise in manufacturing processes, temperature or voltage.

Note that in the second exemplary embodiment, the relative weightings CWb to CWd are computed for each of the taps b to d with tap a as the reference, however it is sufficient to set 2 or more taps as the calibration targets. For example, 2 taps having large numerical values out of the weightings Wb, Wc, Wd, and hence having small overall resistance values Ro, may be set as the calibration target taps.

Third Exemplary Embodiment

Explanation follows regarding a third exemplary embodiment of technology disclosed herein. Note that since basic configuration of the third exemplary embodiment is similar to that of the first exemplary embodiment, the same reference numerals are allocated in the third exemplary embodiment to similar functional components to those of the first exemplary embodiment, and further explanation is omitted thereof. Moreover, in the third exemplary embodiment, as an example, setting is performed of the weighting CWc for the tap c, with the tap a as a reference.

Figure 13:
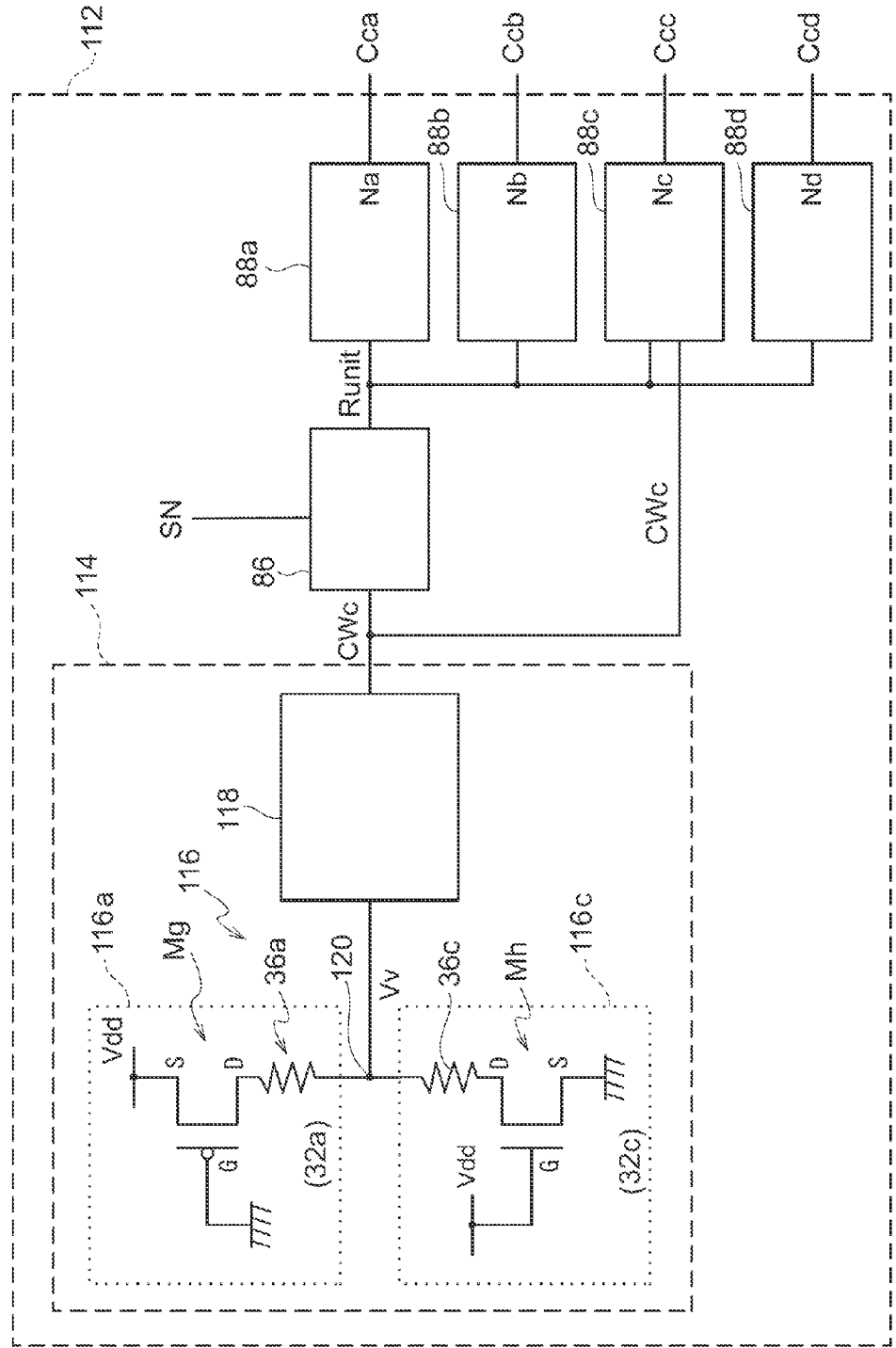
FIG. 13 is a functional block diagram illustrating an example of a code setting section according to a third exemplary embodiment.

FIG. 13 illustrates a code setting section 112 according to the third exemplary embodiment. The code setting section 112 is employed in place of the code setting section 52 according to the first exemplary embodiment. The code setting section 112 functions as an example of a setting section of the third exemplary embodiment. The code setting section 112 includes a weighting setting section 114. The weighting setting section 114 is employed in place of the weighting setting section 70 according to the first exemplary embodiment.

The weighting setting section 114 includes a displacement detection section 116 and a weighting computation section 118. The displacement detection section 116 functions as an example of an individual detection section in the third exemplary embodiment. The displacement detection section 116 includes a replica circuit 116a that includes a transistor Mg and resistor element 36a corresponding to the driver unit 32a of the tap a serving as the reference tap. The displacement detection section 116 includes a replica circuit 116c that includes a transistor Mh and resistor element 36c corresponding to the driver unit 32c of the tap c serving as a calibration target. The replica circuits 116a, 116c function as an example of a replica circuits employed in an individual detection section in the third exemplary embodiment.

In the displacement detection section 116, resistor elements 36a and 36c are connected together in series, and resistor elements 36a and 36c are connected to the drain D of the transistor Mg and the drain D of the transistor Mh. In the displacement detection section 116, the gate G of the transistor Mg of the replica circuit 116a is connected to ground, and a voltage Vdd is applied to the gate G of the transistor Mh of the replica circuit 116c. Thus in the displacement detection section 116 the transistor Mg of the replica circuit 116a and the transistor Mh of the replica circuit 116c are driven ON.

In the displacement detection section 116, the transistors Mg and Mh are driven ON, and so a voltage Vv is output from a node 120 at a connection point between the resistor element 36a of the replica circuit 116a and the resistor element 36c of the replica circuit 116c. The voltage Vv is a voltage according to the ratio of the resistance value corresponding to the resistance value Rxa of the driver unit 32a and the resistance value corresponding to the resistance value Rxc of the driver unit 32c. In the displacement detection section 116, the voltage Vv changes when there is a change in at least one of the relative value of the output resistance value of the driver unit 32a and the output resistance value of the driver unit 32c, or the voltage Vdd.

The weighting computation section 118 computes the weighting CWc of the tap c with respect to the weighting Wa of the tap a based on the voltage Vv. The weighting computation section 118 may, for example, be formed using a logic circuit that executes a general computation equation such as the following.

$$CWc = Wa \cdot (Vdd - Vv)/Vv$$

The unit setting section 86 sets the resistance value Runit employing the weighting CWc of the tap c. The individual setting sections 88a to 88d set the operation numbers Na to Nd using the resistance value Runit and the weighting Wa, Wb, CWc, Wd. The individual setting sections 88a to 88d output adjustment codes Cca to Ccd based on the set operation numbers Na to Nd.

The driver circuits 30a to 30d switch the operation/non-operation of each of the driver units 32a to 32d using the adjustment codes Cca to Ccd, and the operation numbers Na to Nd of the driver units 32a to 32d that are to operate. By operating the operation numbers Na to Nd of the driver units 32a to 32d, the transmission circuit 10 suppresses changes in the final terminal resistance value Zout and suppresses changes in the circuit characteristics even when changes occur in the manufacturing process, temperature or voltage. The code setting section 112 is able to achieve a reduction in the number of components due to the resistor element 78 or the like not being required to compute the weighting W of the calibration target taps (for example the weighting CWc of the tap c).

Fourth Exemplary Embodiment

Explanation next follows regarding a fourth exemplary embodiment of technology disclosed herein. Note that since basic configuration of the fourth exemplary embodiment is similar to that of the second exemplary embodiment, the same reference numerals are allocated in the fourth exemplary embodiment to similar functional components to those of the second exemplary embodiment, and further explanation is omitted thereof.

Figure 14:
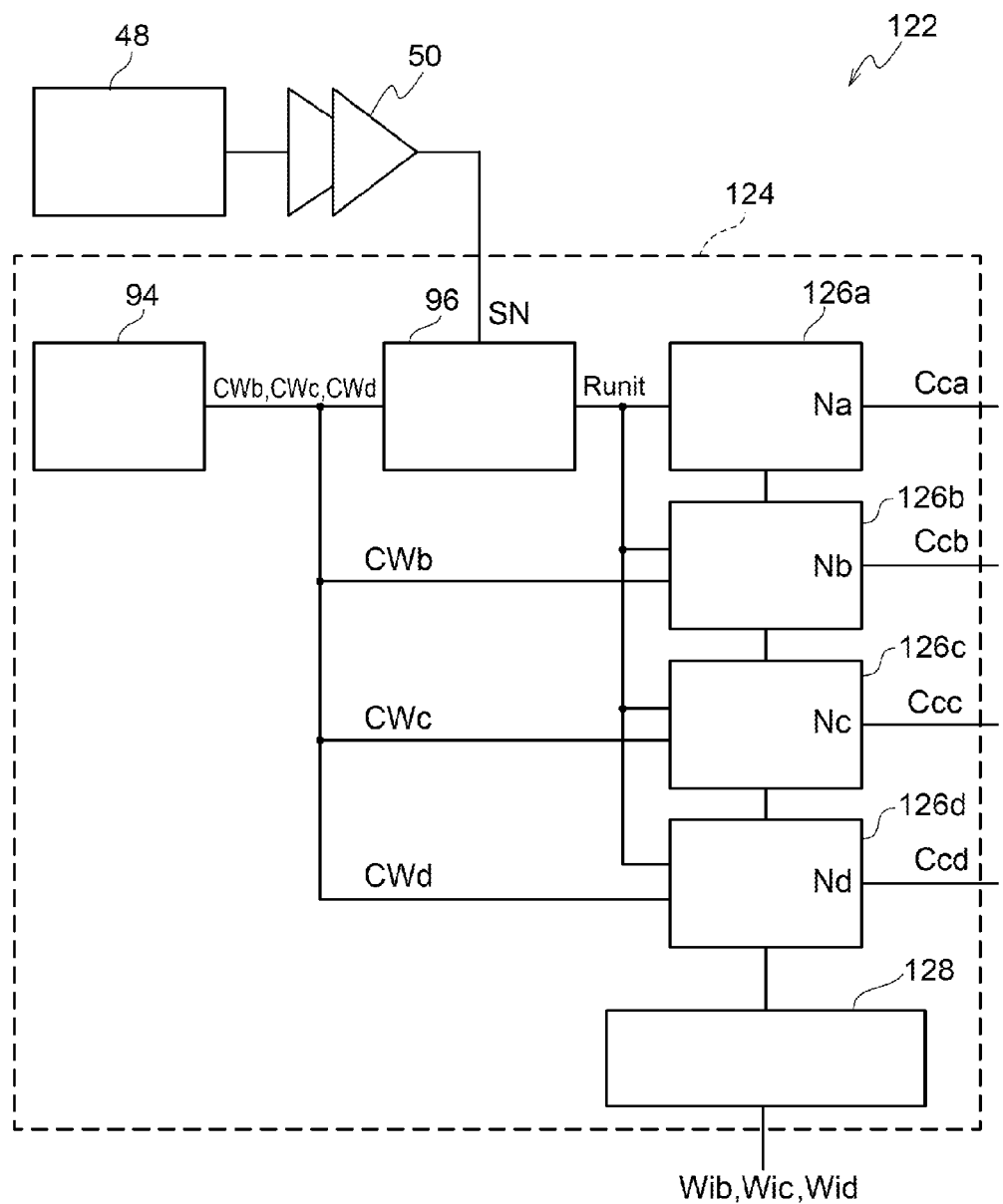
FIG. 14 is a functional block diagram illustrating an example of an adjustment control section according to a fourth exemplary embodiment.

FIG. 14 illustrates an adjustment control section 122 according to the fourth exemplary embodiment. The adjustment control section 122 is employed in place of the adjustment control section 90 according to the second exemplary embodiment. The adjustment control section 122 includes a basic setting section 48, a buffer section 50 and a code setting section 124. The code setting section 124 includes a weighting setting section 94 and a unit setting section 96. The code setting section 124 functions as an example of a setting section in the fourth exemplary embodiment.

The code setting section 124 includes individual setting sections 126a, 126b, 126c, 126d and a weighting receiving section 128. The individual setting sections 126a to 126d are employed in place of the individual setting sections 98a to 98d of the second exemplary embodiment. The individual setting sections 126a to 126d function as an example of individual setting sections in the fourth exemplary embodiment.

For example, when the transmission line 16 is substituted in the signal transmission device 12, the transmission line 16 changes in characteristics such as high frequency signal loss even when there is no change in the characteristic impedance Zo. The transmission circuit 10 provided with the FFE function is preferably capable of changing properties such as the degree of de-emphasis (degree of attenuation) for each of the taps according to changes in characteristics such as the loss in high frequency signals of the transmission line 16. The transmission circuit 10 that performs de-emphasis using the FFE function, changes the de-emphasis by changing the relationship weightings between the taps a to d, even without changing the settings of the delay times for each of the taps a to d in the signal converter 20, or changing the settings of whether or not to perform polarity reversal. The transmission circuit 10 is accordingly capable of finely adjusting effects such as the degree of de-emphasis by changing the weightings, or the relative values of the weightings, of the taps a to d.

The adjustment control section 122 includes the weighting receiving section 128. The weighting receiving section 128 receives input of the weightings Wib, Wic, Wid for the taps b to d other than the reference tap a. The individual setting sections 126a to 126d set the operation numbers Na to Nd when the weighting receiving section 128 has received the weightings Wib to Wid, the pre-set weightings Wb to Wd are replaced, and the weightings Wib, Wic, Wid received by the weighting receiving section 128 employed. The weighting receiving section 128 is stored with the pre-set weightings Wa to Wd. When new weightings Wib to Wid have not been input, the individual setting sections 126a to 126d employ the pre-set weightings Wa to Wd that are stored in the weighting receiving section 128 when setting the operation numbers Na to Nd. Note that the weighting receiving section 128 may be configured to receive a weighting Wi corresponding to at least one of the taps out of the taps b to d other than the reference tap a. In such cases, the pre-set weightings W are employed for taps other than the tap for which the weighting Wi has been received for setting the operation numbers Na to Nd.

A logic circuit including a storage element or a storage function may, for example, be employed for the weighting receiving section 128. The weighting receiving section 128 receives the weightings Wib to Wid by the weightings Wib, Wic, Wid being written to a storage element or the like. Preferably a non-volatile storage element is employed when a storage element is employed in the weighting receiving section 128, thereby enabling loss of the received weightings Wib, Wic, Wid to be prevented.

The weighting receiving section 128 is not limited to including a storage element, and may include a function enabling the weightings Wib, Wic, Wid to be input each of the individual setting sections 126b to 126d other than the reference tap a. The weighting receiving section 128 may be configured so as to enable the new weightings Wib, Wic, Wid to be input to the individual setting sections 126b to 126d from outside of the semiconductor integrated circuit 18.

The individual setting sections 126a to 126d employed in the adjustment control section 122 may be formed by employing a logic circuit that executes, for example, the following computation equations when setting the operation numbers Na to Nd for the driver units 32a to 32d. The following computation equations are obtained from Equations (1) to (6). Note that in the computation equations illustrated below, the weightings Wib to Wid may be replaced by the weightings Wb to Wd in cases in which the weightings Wib to Wid are not input.

$$Na=Runit/(Zo \cdot Wa \cdot (Wa+Wib+Wic+Wid))$$

$$Nb=Runit/(Zo \cdot CWb \cdot (Wa+Wib+Wic+Wid))$$

$$Nc=Runit/(Zo \cdot CWc \cdot (Wa+Wib+Wic+Wid))$$

$$Nd=Runit/(Zo \cdot CWd \cdot (Wa+Wib+Wic+Wid))$$

The adjustment control section 122 sets the operation numbers Na to Nd based on the basic operation number SN set by the basic setting section 48, the weightings CWb, CWc, CWd set by the weighting setting section 94, and on the weightings Wib, Wic, Wid input to the weighting receiving section 128.

Consequently, in the transmission circuit 10 in which the adjustment control section 122 is provided, even when the transmission line 16 has been replaced, the transmission signal So obtained with the desired degree of de-emphasis is output whilst matching the final terminal resistance value Zout to the characteristic impedance Zo of the transmission line 16. The adjustment control section 122 is capable of adjusting the degree of de-emphasis without changing settings to the delay time and whether or not to perform polarity reversal of the tap a to tap d.

Note that in the fourth exemplary embodiment, as an example, the individual setting sections 126a to 126d and the weighting receiving section 128 are employed in place of the individual setting sections 98a to 98d of the adjustment control section 90 according to the second exemplary embodiment, however there is no limitation thereto. The individual setting sections 126a to 126d and the weighting receiving section 128 may, for example, be employed in place of the individual setting sections 88a to 88d according to the first exemplary embodiment or the third exemplary embodiment.

Fifth Exemplary Embodiment

Explanation follows regarding a fifth exemplary embodiment of technology disclosed herein. Note that since basic configuration of the fifth exemplary embodiment is similar to that of the first exemplary embodiment, the same reference numerals are allocated in the fifth exemplary embodiment to similar functional components to those of the first exemplary embodiment, and further explanation is omitted thereof.

Figure 15:
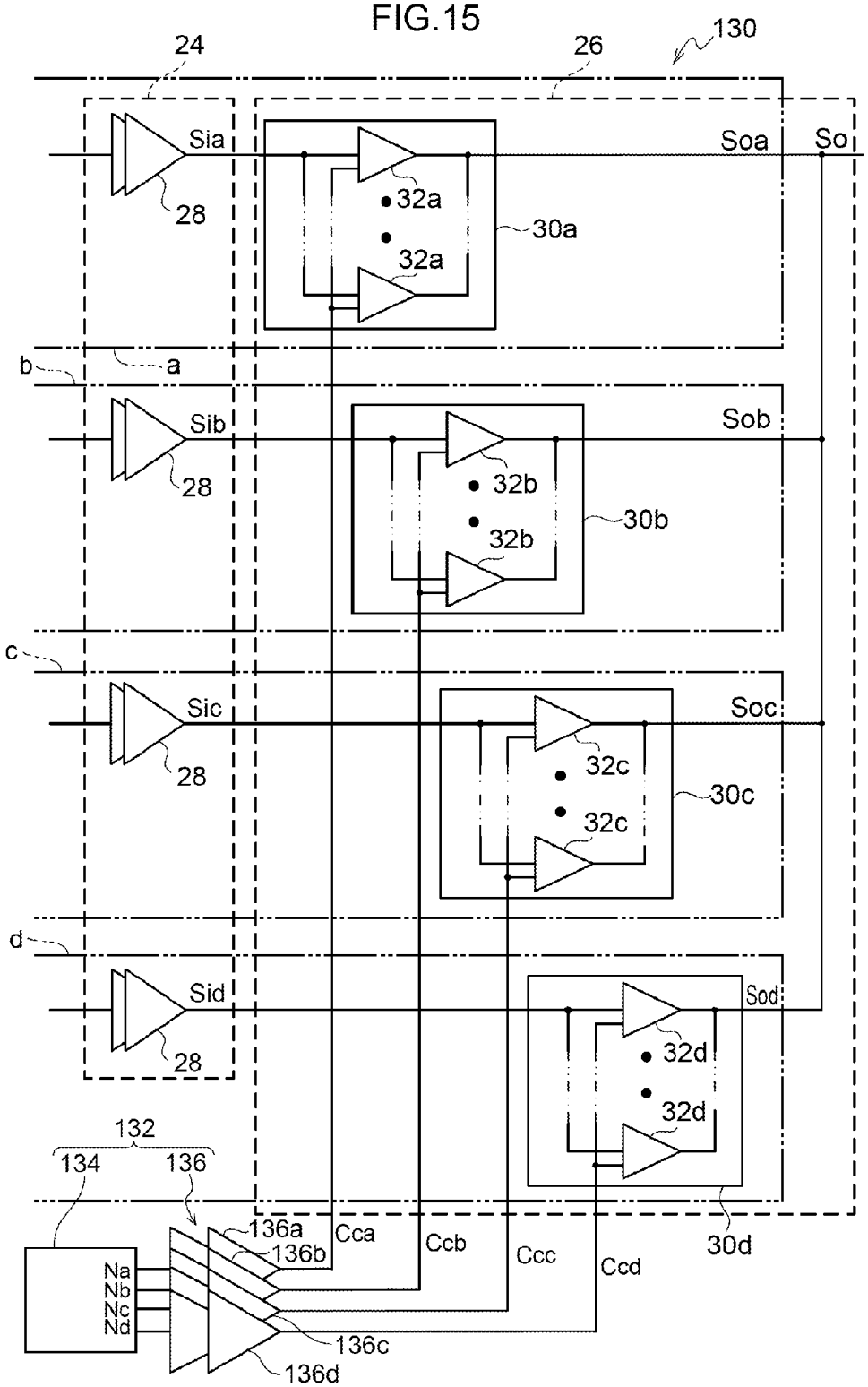
FIG. 15 is a functional block diagram illustrating relevant portions of a transmission circuit according to a fifth exemplary embodiment.

FIG. 15 illustrates a transmission circuit 130 according to the fifth exemplary embodiment. The transmission circuit 130 includes an adjustment control section 132. The adjustment control section 132 is employed in place of the adjustment control section 46 of the first exemplary embodiment. The adjustment control section 132 includes a code setting section 134 and a buffer section 136.

Figure 16:
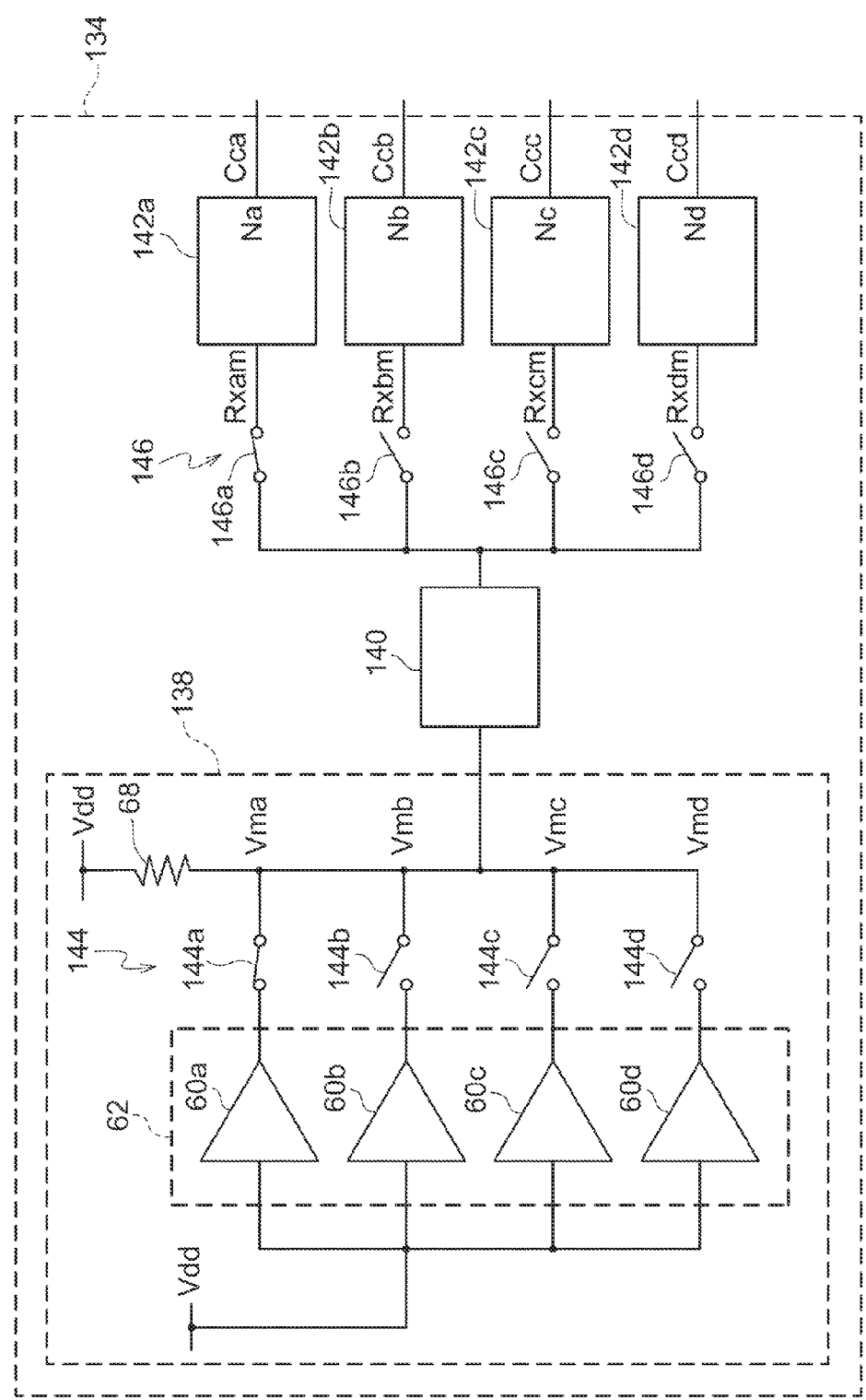
FIG. 16 is a functional block diagram illustrating an example of an adjustment control section according to a fifth exemplary embodiment.

FIG. 16 illustrates an example of the code setting section 134. The code setting section 134 is equipped with a detection section 138, a unit computation section 140, and individual setting sections 142a, 142b, 142c, and 142d. The detection section 138 functions as an example of a voltage detection section in the fifth exemplary embodiment. The replica units 60a to 60d function as an example of the replica circuit employed in the voltage detection section of the fifth exemplary embodiment. The unit computation section 140 and the individual setting sections 142a to 142d function as an example of a setting section that sets an operation number based on the output voltage of the replica circuit detected by the voltage detection section in the fifth exemplary embodiment.

The detection section 138 includes a replica circuit 62 employing replica units 60a to 60d and a reference resistor element 68 for use in calibration. The detection section 138 includes switching elements 144 (144a to 144d). The detection section 138 differs from the base voltage detection section 54 according to the first exemplary embodiment in the point that the switching elements 144a to 144d are included.

The switching elements 144a to 144d are provided between the replica circuit 62 and the reference resistor element 68. The switching element 144a corresponds to the replica unit 60a, the switching element 144b corresponds to the replica unit 60b, the switching element 144c corresponds to the replica unit 60c, and the switching element 144d corresponds to the replica unit 60d. The switching elements 146a to 146d are connected to the unit computation section 140 and the individual setting sections 142a to 142d. The switching element 146a corresponds to the individual setting section 142a, the switching element 146b corresponds to the individual setting section 142b, the switching element 146c corresponds to the individual setting section 142c, and the switching element 146d corresponds to the individual setting section 142d.

In the code setting section 134, the switching elements 144a to 144d are closed one at a time. In the detection section 138, the replica unit 60a and the reference resistor element 68 are connected when the contact point of the switching element 144a is closed, and voltage Vma is output according to the resistance value of the transistor Mh and the resistance value of the resistor element 36a within the replica unit 60a (see FIG. 2). Similarly, the detection section 138 outputs a voltage Vmb according to the resistance value corresponding to the resistance value Rxb of the driver unit 32b on closing the contact point of the switching element 144b. The detection section 138 outputs a voltage Vmc according to the resistance value corresponding to the resistance value Rxc of the driver unit 32c on closing the contact point of the switching element 144c. The detection section 138 outputs a voltage Vmd according to the resistance value corresponding to the resistance value Rxd of the driver unit 32d on closing the contact point of the switching element 144b.

In the unit computation section 140, the voltages Vma to Vmd are individually input by closing the switching elements 144a to 144d one at a time. The unit computation section 140 computes the actual resistance values Rxam to Rxdm corresponding to the resistance values Rxa to Rxd of the driver units 32a to 32d based on the voltages Vma to Vmd and on the resistance value Rcal of the reference resistor element 68 used in calibration.

The unit computation section 140 may, for example, be formed using a logic circuit that executes the following computation equation (wherein Rxm=Rxam to Rxdm, and Vcal=Vma to Vmd).

$$Rxm=(Vcal \cdot Rcal)/(Vdd-Vcal)$$

The code setting section 134 synchronizes and operates the switching elements 144a to 144d and the switching elements 146a to 146d. The code setting section 134 synchronizes closure of the switching element 144a and the switching element 146a, and synchronizes closure of the switching element 144b and the switching element 146b. The code setting section 134 also synchronizes closure of the switching element 144c and the switching element 146c, and synchronizes closure of the switching element 144d and the switching element 146d.

The resistance value Rxam corresponding to the driver unit 32a is input to the individual setting section 142a by closing the switching elements 144a and 146a, and the resistance value Rxbm corresponding to the driver unit 32b is input to the individual setting section 142b by closing the switching elements 144b and 146b. The resistance value Rxcm corresponding to the driver unit 32c is input to the individual setting section 142c by closing the switching elements 144c and 146c, and the resistance value Rxdm corresponding to the driver unit 32d is input to the individual setting section 142d by closing the switching elements 144d and 146d.

The individual setting sections 142a to 142d employ the resistance values Rxam to Rxdm, and the overall resistance values Roa to Rod set in the driver circuits 30a to 30d to set the operation numbers Na to Nd of the driver units 32a to 32d for the driver circuits 30a to 30d.

The overall resistance values Roa to Rod are each set in the driver circuits 30a to 30d in consideration of the weighting W. The operation numbers Na to Nd of the driver units 32a to 32d required to obtain the overall resistance values Roa to Rod of the driver circuits 30a to 30d corresponding to the weightings Wa to Wd are obtained from the overall resistance values Roa to Rod and the resistance values Rxam to Rxdm based on the voltages Vma to Vmd.

The individual setting sections 142a to 142d may, for example, be formed using logic circuits that execute a computation equations such as the following based on the Equations (1) to (6).

$Na = Rxam/Roa$ $Nb = Rxbm/Rob$ $Nc = Rxcm/Roc$ $Nd = Rxdm/Rod$

As illustrated in FIG. 15, the buffer section 136 includes a register buffer circuit 136a corresponding to the driver circuit 30a, and includes a register buffer circuit 136b corresponding to the driver circuit 30b. The buffer section 136 also includes a register buffer circuit 136c corresponding to the driver circuit 30c and a register buffer circuit 136d corresponding to the driver circuit 30d.

The register buffer circuits 136a to 136d store and hold adjustment codes Cca to Ccd output from the adjustment control section 132. The register buffer circuits 136a to 136d output the adjustment codes Cca to Ccd to the corresponding driver circuits 30a to 30d. In the transmission circuit 130 the operation numbers Na to Nd of the driver units 32a to 32d are controlled for the respective driver circuits 30a to 30d based on the adjustment codes Cca to Ccd output by the adjustment control section 132.

Consequently, in the transmission circuit 130, the final terminal resistance value Zout is matched to the characteristic impedance Zo of the transmission line 16 even though the resistance values of the elements provided in the driver unit 32 change due to such factors as manufacturing process changes, temperature changes and voltage changes.

Sixth Exemplary Embodiment

Explanation next follows regarding a sixth exemplary embodiment of technology disclosed herein. Note that since basic configuration of the sixth exemplary embodiment is similar to that of the first exemplary embodiment, the same reference numerals are allocated in the sixth exemplary embodiment to similar functional components to those of the first exemplary embodiment, and further explanation is omitted thereof.

Figure 17:
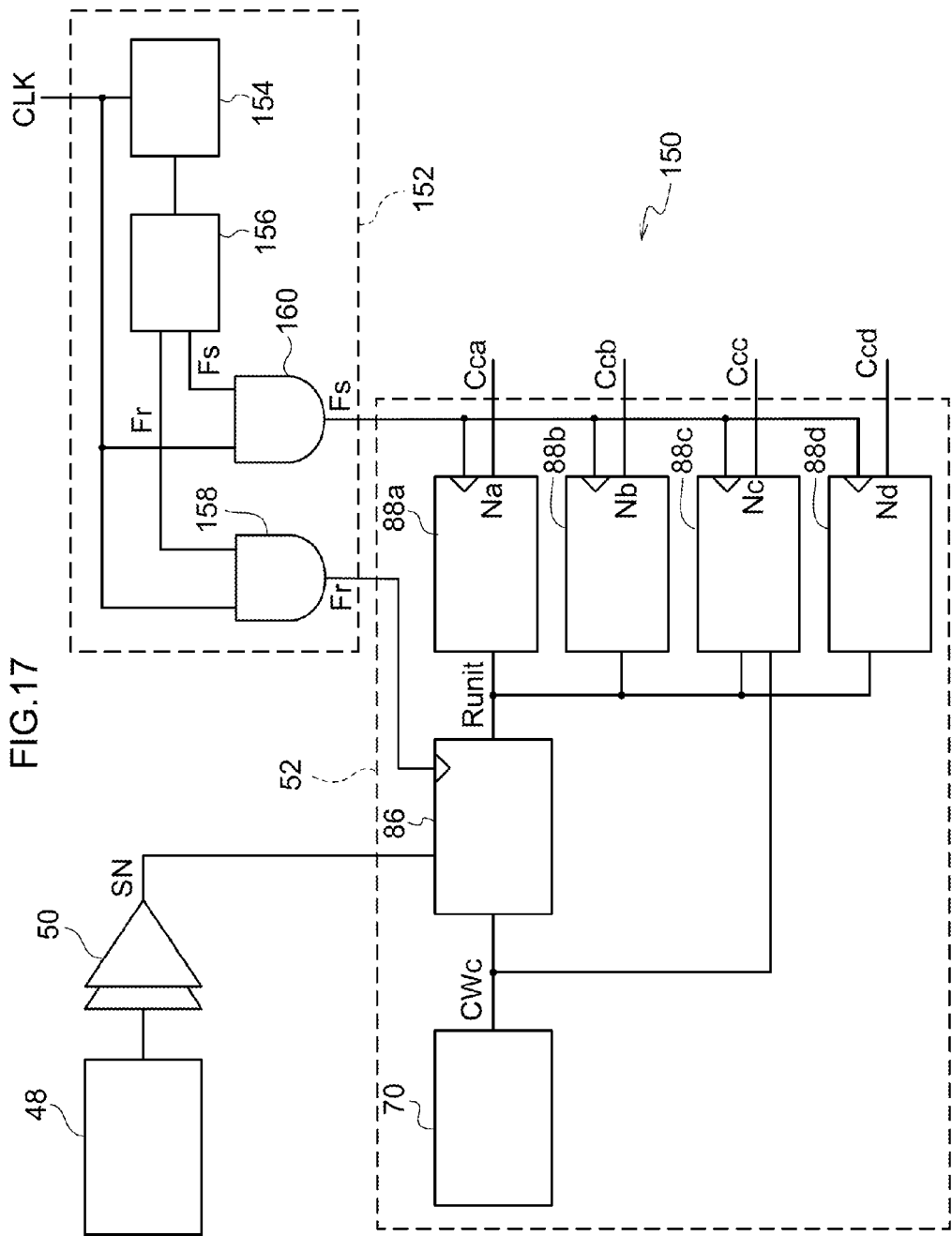
FIG. 17 is a functional block diagram illustrating an example of an adjustment control section according to a sixth exemplary embodiment.

FIG. 17 illustrates an adjustment control section 150 according to the sixth exemplary embodiment. The adjustment control section 150 is employed in place of the adjustment control section 46 of the transmission circuit 10 according to the first exemplary embodiment.

The adjustment control section 150 includes a basic setting section 48, a buffer section 50 and a code setting section 52. The basic setting section 48 sets a basic operation number SN, the buffer section 50 holds the basic operation number SN. The buffer section 50 also outputs the held basic operation number SN to the code setting section 52.

The code setting section 52 includes a weighting setting section 70, a unit setting section 86, and individual setting sections 88a to 88d. The code setting section 52, for example, sets a weighting CWc of a calibration target tap c with a weighting Wa of the tap a as a reference, and sets a resistance value Runit based on the basic operation number SN, and the weightings Wa, Wb, CWc, Wd of the taps a to d. In the code setting section 52, the individual setting sections 88a to 88d set operation numbers Na to Nd based on the resistance value Runit, the weighting Wa, Wb, CWc, Wd and the overall resistance values Roa, Rob, Roc, Rod.

The adjustment control section 150 includes an operation control section 152. The operation control section 152 controls the operation of the code setting section 52. The operation control section 152 includes a specific bit counter section 154, a flag control section 156, and two AND circuits 158, 160. The AND circuit 158 is provided corresponding to the unit setting section 86, and the AND circuit 160 is provided corresponding to the individual setting sections 88a to 88d. The counter section 154, the flag control section 156 and the AND circuit 158 function as an example of a first time measurement section of the sixth exemplary embodiment. The counter section 154, the flag control section 156 and the AND circuit 160 function as an example of a second time measurement section of the sixth exemplary embodiment.

On input of a clock signal CLK, the counter section 154 of the operation control section 152 outputs an operation signal to the flag control section 156 based on the input clock signal CLK. On input of the operation signal, the flag control section 156 outputs flag signals Fr, Fs corresponding to the input operation signal.

Input terminals of the AND circuit 158 are input with the clock signal CLK and the flag signal Fr output by the flag control section 156. The output terminal of the AND circuit 158 is connected to the unit setting section 86, and the clock signal CLK is output to the unit setting section 86 by the flag signal Fr being at H level (ON). On input of the clock signal CLK the unit setting section 86 synchronizes to the clock signal CLK and operates, starting setting the resistance value Runit.

The input terminal of the AND circuit 160 is input with the clock signal CLK and the flag signal Fs output by the flag control section 156. The output terminal of the AND circuit 160 is connected to each of the individual setting sections 88a to 88d, and the clock signal CLK is output to each of the individual setting sections 88a to 88d by the flag signal Fs being at H level (ON). On input of the clock signal CLK, the individual setting sections 88a to 88d synchronize to the clock signal CLK and operate, starting setting of the operation numbers Na to Nd.

In the operation control section 152, the counter section 154 and the flag control section 156 function as a timer to operate the code setting section 52. For example, the counter section 154 counts the clock signal CLK, and outputs a specific operation signal (for example a pulse of 1 clock) to the flag control section 156 every time the count value reaches a specific value.

The flag control section 156 for example counts the operation signal, and determines whether or not a pre-set period of time has elapsed from the count value. When this is being performed, the flag control section 156 switches ON the flag signal Fr when a specific period of time Tr has elapsed since first input of the operation signal. The flag control section 156 switches ON the flag signal Fs when a specific period of time Ts has elapsed since the flag signal Fr was switched ON.

The flag control section 156 is set as time Tr with a time from power being supplied to the semiconductor integrated circuit 18 and operation of the adjustment control section 150 starting, until setting of the basic operation number SN and computation of weightings for the calibration target taps has been completed. The flag control section 156 is set as time Ts with a time from when the flag signal Fr becomes ON until setting of the resistance value Runit by the unit setting section 86 has been completed. The counter section 154 and the flag control section 156 are formed by employing a general logic element.

Figure 18:
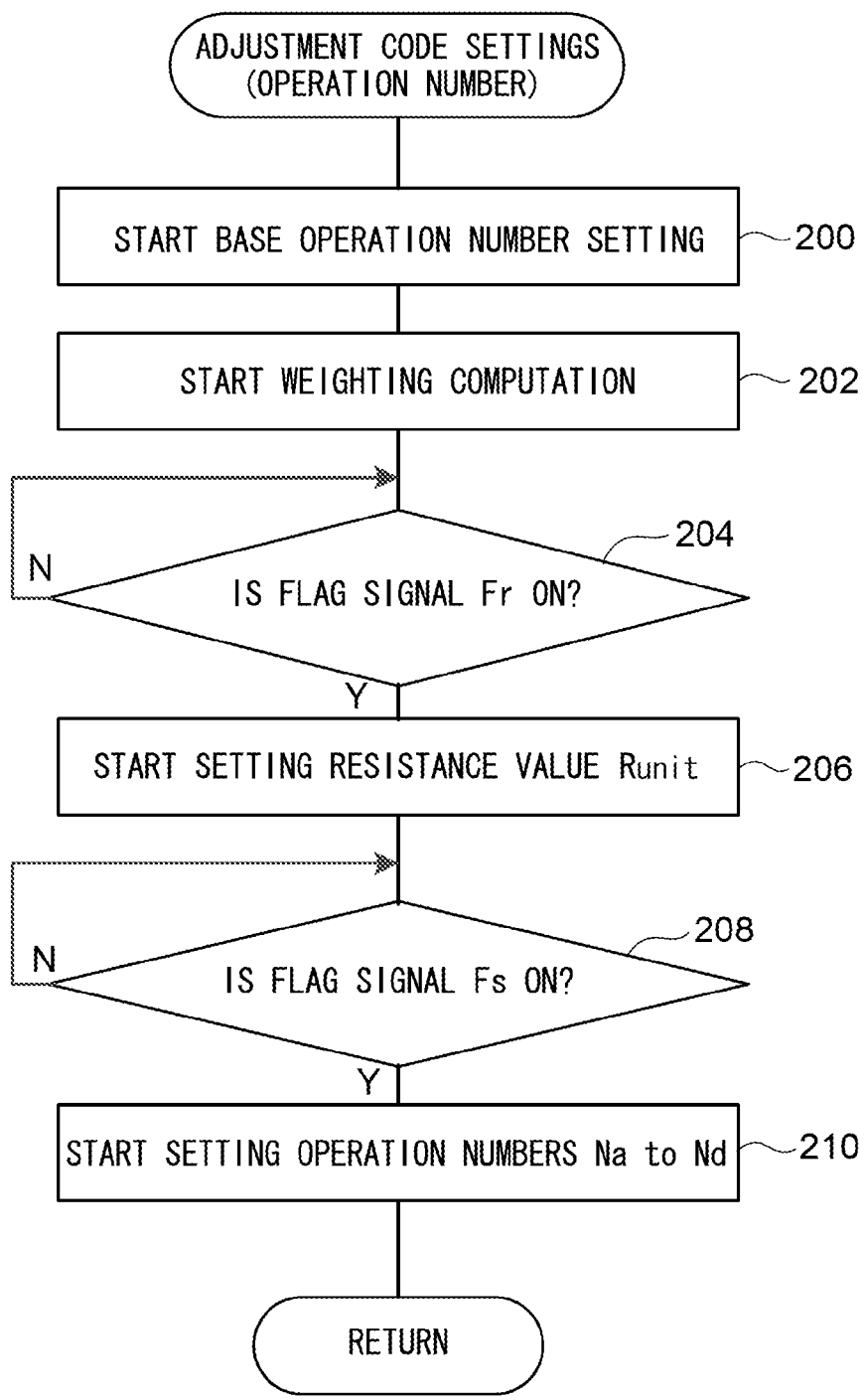
FIG. 18 is a flow diagram illustrating an example of processing of an adjustment control section according to the sixth exemplary embodiment.

Explanation next follows regarding a flow of processing in the adjustment control section 150 containing the code setting section 52 that operates under control of the operation control section 152, with reference to FIG. 18. The adjustment control section 150 for example starts operation when power is supplied to the semiconductor integrated circuit 18 and the clock signal CLK is input. In the adjustment control section 150, first the basic setting section 48 operates and setting processing of the basic operation number SN is started (step 200). In the adjustment control section 150, the weighting setting section 70 then operates and starts computation processing of the weighting W (CWc) of the calibration target tap (step 202). In the operation control section 152, the counter section 154 then starts to count the clock signal CLK, and outputs an operation signal to the flag control section 156 at intervals of a specific period of time.

The flag control section 156 outputs (switches ON) the flag signal Fr when the specific time Tr has elapsed from the time the operation signal was first input. The flag signal Fr is switched ON after the time Tr has elapsed from when the basic setting section 48 and the weighting setting section 70 start operation. Consequently, the flag signal Fr is switched ON after setting of the basic operation number SN and computation of the weighting CWc has finished.

When the flag signal Fr is ON, the AND circuit 158 outputs the clock signal CLK to the unit setting section 86 (affirmative determination at step 204). On input of the clock signal CLK, the unit setting section 86 synchronizes to the clock signal CLK and starts setting the resistance value Runit (step 206).

The flag control section 156 outputs the flag signal Fs to the AND circuit 160 after the specific time Ts has elapsed since the flag signal Fr became ON (switches the flag Fs ON). The flag signal Fs is set so as to be output when the time Ts has elapsed since the flag signal Fr became ON. The flag signal Fs is accordingly switched ON after setting of the resistance value Runit has been completed.

When the flag signal Fs is ON, the AND circuit 160 outputs the clock signal CLK to each of the individual setting sections 88a to 88d (affirmative determination at step 208). On input of the clock signal CLK, the individual setting sections 88a to 88d synchronize to the clock signal CLK and operate, starting setting of the operation numbers Na to Nd of the driver units 32a to 32d for the respective driver circuits 30a to 30d (step 210).

Then when setting of the operation numbers Na to Nd for each of the individual setting sections 88a to 88d has been completed in the adjustment control section 150, the adjustment codes Cca to Ccd according to the set operation numbers Na to Nd are respectively output to each of the driver circuits 30a to 30d. Consequently, providing the operation control section 152 to the adjustment control section 150 enables setting of the operation numbers Na to Nd to be performed smoothly every time the semiconductor integrated circuit 18 is connected to a power supply and power starts to be supplied.

Note that in the sixth exemplary embodiment, configuration is made such that operation of the adjustment control section 150 and the operation control section 152 starts when power starts to be supplied to the semiconductor integrated circuit 18, however the starting of operation of the adjustment control section 150 and the operation control section 152 is no limited thereto. For example, configuration may be made such that a reset mechanism to reset the adjustment control section 150 and the operation control section 152 is provided, and operation of the adjustment control section 150 and the operation control section 152 is started each time of resetting is performed by the reset mechanism. Consequently, in the transmission circuit 10, the operation numbers Na to Nd are reset at a selected timing, and the appropriate operation number Na to Nd of the driver units 32a to 32d is reset according to the voltage and temperature at these points in time.

Seventh Exemplary Embodiment

Explanation follows regarding a seventh exemplary embodiment according to technology disclosed herein. Note that since basic configuration of the seventh exemplary embodiment is similar to that of the first exemplary embodiment, the same reference numerals are allocated in the seventh exemplary embodiment to similar functional components to those of the first exemplary embodiment, and further explanation is omitted thereof In the first exemplary embodiment, various computations are executed using logic circuits, however in the seventh exemplary embodiment, a program is executed in place of the logic circuits. In the seventh exemplary embodiment, setting of the operation numbers Na to Nd for the driver units 32a to 32d of the driver circuits 30a to 30d is performed by executing a program.

Figure 19:
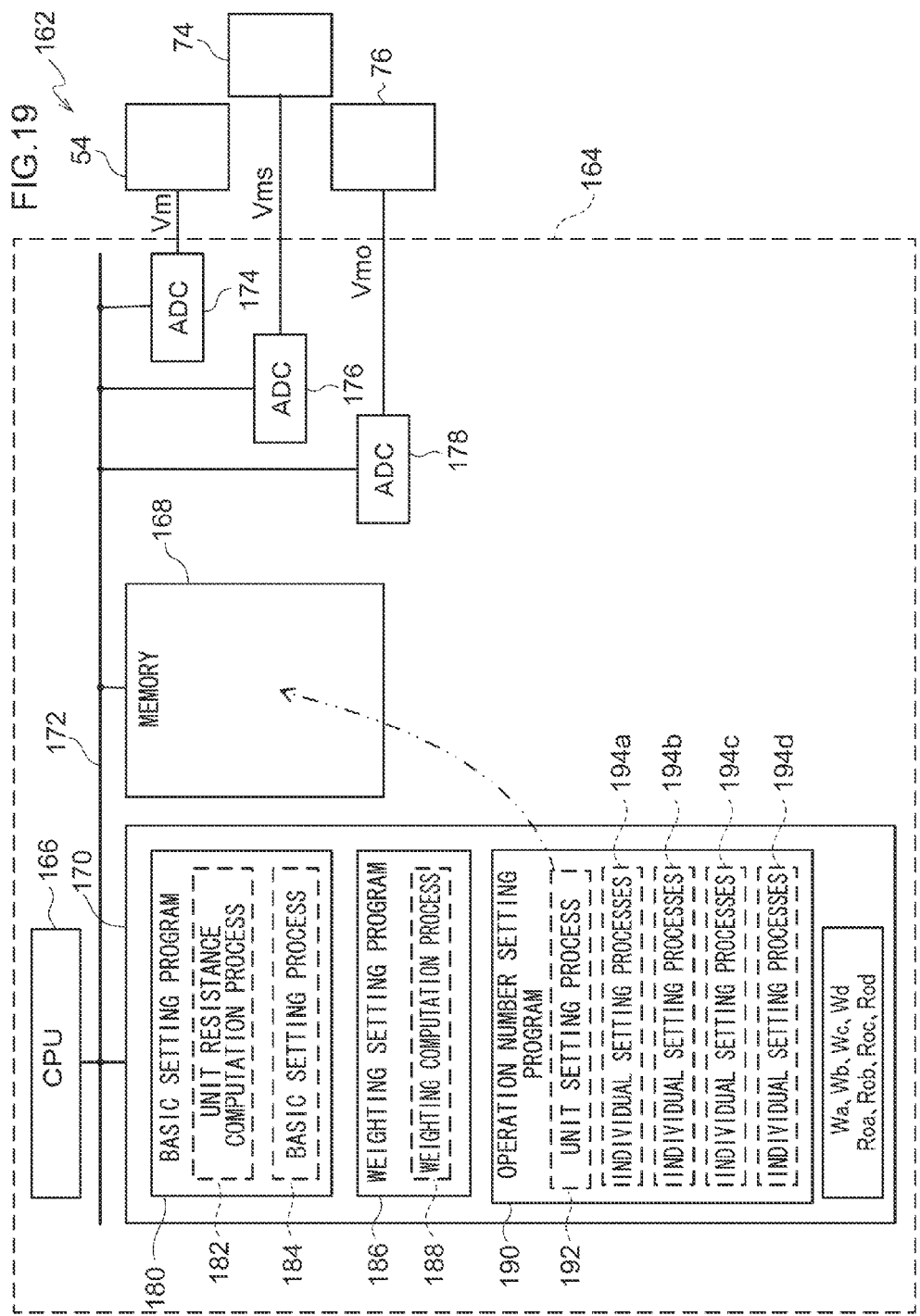
FIG. 19 is a functional block diagram illustrating an example of an adjustment control section according to a seventh exemplary embodiment.

FIG. 19 illustrates an adjustment control section 162 according to the seventh exemplary embodiment. The adjustment control section 162 is employed in the seventh exemplary embodiment in place of the adjustment control section 46 according to the first exemplary embodiment. The adjustment control section 162 includes a computer 164. The computer 164 includes a CPU 166, a memory 168, and a nonvolatile storage section 170, with these being connected together by a bus 172.

The adjustment control section 162 includes a base voltage detection section 54, a reference detection section 74 and a target detection section 76. The base voltage detection section 54 the reference detection section 74 and the target detection section 76 are for example each connected to the bus 172 through A-D converters (ADC) 174, 176, 178. The computer 164 is thereby input with a voltage Vm detected by the base voltage detection section 54, by a voltage Vms detected by the reference detection section 74, and by a voltage Vmo detected by the target detection section 76.

A basic setting program 180 to cause the computer 164 to operate as the basic setting section 48 is stored in the storage section 170 of the computer 164. The basic setting program 180 includes a unit resistance computation process 182 that caused the computer 164 to operate as the unit resistance computation section 56, and a basic setting process 184 that causes the computer 164 to operate as the basic setting section 58.

A weighting setting program 186 is also stored in the storage section 170 to cause the computer 164 to operate as the weighting setting section 70. The weighting setting program 186 includes a weighting computation process 188 that causes the computer 164 to function as the weighting computation section 84.

An operation number setting program 190 is also stored in the storage section 170 to cause the computer 164 to operate as the operation number setting section 72. The operation number setting program 190 includes a unit setting process 192 that causes the computer 164 to operate as the unit setting section 86. The operation number setting program 190 also includes individual setting processes 194a, 194b, 194c, 194d for causing the computer 164 to operate as the individual setting sections 88a, 88b, 88c, 88d.

When the adjustment control section 162 is implemented by the computer 164 data such as the weighting Wa, Wb, Wc, Wd set for each of the taps a to d, and the overall resistance values Roa to Rod of the driver circuits 30a to 30d are stored in the storage section 170.

The CPU 166 reads the basic setting program 180 from the storage section 170 and expands the basic setting program 180 into the memory 168, and then executes in sequence the processes of the unit resistance computation process 182 and the basic setting process 184 of the basic setting program 180. The CPU 166 reads the weighting setting program 186 from the storage section 170, expands the weighting setting program 186 into the memory 168 and then executes in sequence the processes of the weighting computation process 188 of the weighting setting program 186.

The CPU 166 reads the operation number setting program 190 from the storage section 170, expands the operation number setting program 190 into the memory 168, and then executes in sequence the processes of the unit setting process 192 and the individual setting processes 194a, 194b, 194c, 194d of the operation number setting program 190.

Explanation next follows regarding a flow of processing executed by the adjustment control section 162, with reference to FIG. 20. Note that in FIG. 20, processing corresponding to that of FIG. 18 is shown together with the corresponding step number from FIG. 18 appended in brackets.

The computer 164 of the adjustment control section 162 starts operation on supply of power to the semiconductor integrated circuit 18. The adjustment control section 162 starts operation of the base voltage detection section 54, the reference detection section 74 and the target detection section 76 on supply of power to the semiconductor integrated circuit 18.

In the first step 220 of the flow chart of FIG. 20, the computer 164 reads the voltage Vm output from the base voltage detection section 54, and at step 222 computes one slice's worth of the resistance value Rslice based on the voltage Vm. At step 224, the computer 164 sets the basic operation number SN based on the resistance value Rslice and the target final terminal resistance value Zout.

At step 226, the computer 164 reads the voltage Vms output from the reference detection section 74, and reads the voltage Vmo output from the target detection section 76. At step 228, the computer 164 computes the weighting Wc (CWc) of the calibration target tap c from the read voltages Vms, Vmo and the weighting Wa of the reference tap a. Note that the steps 220 to 224 and the steps 226 to 228 may be performed in parallel.

At step 230, the computer 164 checks whether or not the basic operation number SN and the weighting CWc for the calibration target tap c have been obtained, and processing proceeds to step 232 when affirmative determination is made. At step 232, the computer 164 performs setting of the resistance value Runit. The setting of the resistance value Runit employs the basic operation number SN, the target value (Zo) of the final terminal resistance value Zout, the weighting CWc computed for the calibration target tap c, and the weightings Wa, Wb, Wd of the taps a, b, d other than the tap c.

The computer 164 proceeds to step 234 when setting of the resistance value Runit is complete, and performs setting of the operation numbers Na to Nd corresponding to each of the taps a to d. The computer 164 proceeds to step 236 when setting of the operation numbers Na to Nd is complete, and outputs the adjustment codes Cca to Ccd according to the set operation numbers Na to Nd to the driver circuits 30a to 30d.

In the transmission circuit 10, the driver units 32a to 32d are operated according to the operation numbers Na to Nd by inputting the adjustment codes Cca to Ccd for each of the driver units 32a to 32d of the driver circuits 30a to 30d. The transmission circuit 10 thereby matches the final terminal resistance value Zout to the characteristic impedance Zo even when there is change in the resistance values of the driver units 32a to 32d, due not only to changes in the manufacturing processes, but also to changes in the temperature and changes in the voltage. The transmission circuit 10 also suppresses changes in the weighting caused by changes in resistance value, and so outputs the transmission signal So with the desired degree of de-emphasis. The transmission circuit 10 is thereby able to perform data transmission so as to enable the reception circuit 14 to demodulate the input signal Si with high precision.

In the seventh exemplary embodiment as explained above, the adjustment control section 162 containing the computer 164 is employed in place of the adjustment control section 46 according to the first exemplary embodiment, however the computer 164 may be appropriately employed in the second to the sixth exemplary embodiments. For example, it is possible to employ the computer 164 for the adjustment control section 90 according to the second exemplary embodiment, for the adjustment control section containing the code setting section 112 according to the third exemplary embodiment, or for the adjustment control section 122 according to the fourth exemplary embodiment. Moreover, the computer 164 may also be employed as the adjustment control section 132 according to the fifth exemplary embodiment, or the adjustment control section 150 according to the sixth exemplary embodiment.

Equipping the transmission circuit 10 with the adjustment control section 162 including the computer 164 enables the operation numbers Na to Nd to be set for the driver units 32a to 32d of the driver circuits 30a to 30d at a given pre-set timing. The transmission circuit 10 is accordingly able to match the final terminal resistance value Zout to the transmission line 16 even when not only changes in manufacturing processes arise, but also when temperature changes and voltage changes arise in the semiconductor integrated circuit 18 during operation, enabling an appropriate degree of de-emphasis to be achieved and maintained.

When the computer 164 is employed this enables the transmission circuit 10 to change the weightings W (Wib to Wid)

for the taps b to d other than the reference tap a. The transmission circuit 10 is thereby able not only accommodate for changes in the characteristics of the transmission line 16, but also able to adjust the degree of de-emphasis to a desired amount.

Moreover, the computer 164 may be provided externally to the semiconductor integrated circuit 18, and then connected to the semiconductor integrated circuit 18 at a given timing. In such cases, the computer 164 is connected to the base voltage detection section 54, the reference detection section 74 and the target detection section 76 formed to the semiconductor integrated circuit 18, and acquires the voltages Vm, Vms, Vmo. The computer 164 may also, for example, be connected to the driver circuits 30a to 30d through a buffer circuit, and input to the adjustment codes Cca to Ccd according to the operation numbers Na to Nd to the transmission circuit 10.

Figure 22:
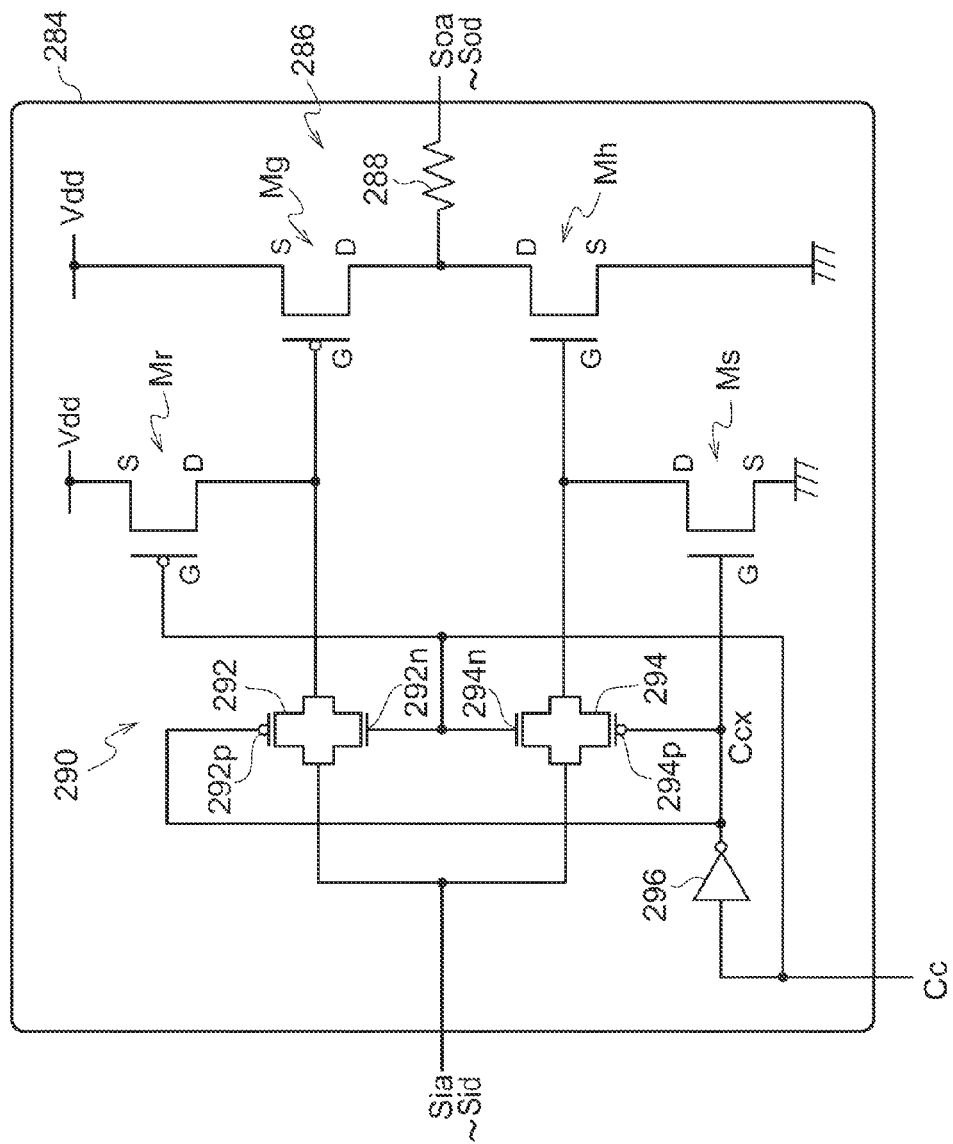
FIG. 22 is a circuit diagram illustrating another example of a switching circuit provided to a driver unit.

In the present exemplary embodiment, the switching circuit 38 is provided to each of the driver unit 32, such that the operation/non-operation of each of the driver unit 32 is switched over according to the adjustment codes Cca to Ccd, however the operation/non-operation of the driver unit 32 is not limited thereto. FIG. 21A, FIG. 21B, and FIG. 22 illustrate a switching section provided in place of the switching circuit 38. Note that in the FIG. 21A, FIG. 21B and FIG. 22, the adjustment codes Cca to Ccd are indicated such as by adjustment code Cc, and with the adjustment code Ccx indicating a signal of the inverted adjustment code Cc.

FIG. 21A illustrates a driver unit 260. The driver unit 260 includes a unit circuit 262. The unit circuit 262 is equipped with transistors Mg, Mh that operate in a complementary manner, and a resistor element 264. The driver unit 260 includes a switching circuit 266. The switching circuit 266 includes a transistor Mm for which a PMOS transistor is employed, a transistor Mn for which an NMOS transistor is employed, and an inverter 268. The transistor Mm is provided on the power source side of the transistor Mg, and the drain D of the transistor Mm and the source S of the transistor Mg are connected together, with a voltage Vdd applied to the source S of the transistor Mm. The transistor Mn is provided on the ground side of the transistor Mh, and the drain D of the transistor Mn is connected to the source S of the transistor Mh, and the source S of the transistor Mn is connected to ground. In the switching circuit 266, either the gate G of the transistor Mm or the gate G of the transistor Mn is connected to the inverter 268. Note that in the switching circuit 266, as an example, the gate G of the transistor Mm is connected to the inverter 268.

The adjustment code Cc is input to the gate G of the transistor Mn of the switching circuit 266, and the adjustment code Ccx that is the adjustment code Cc inverted by the inverter 268 is input to the transistor Mm. Consequently, in the driver unit 260, due to the adjustment code Cc input to the driver unit 260, either both the transistors Mm, Mn are ON, or both the transistors Mm, Mn are OFF.

In the driver unit 260, by switching both the transistors Mm, Mn of the switching circuit 2660N, the voltage Vdd is applied to the source S of the transistor Mg of the unit circuit 262, and the source S of the transistor Mh is connected to ground. Thereby, in the driver unit 260, by switching ON the transistors Mm, Mn of the switching circuit 266, the signals Sia to Sid are input to the gates G of both the transistors Mg, Mh, and a signal of voltage according to the signals Sia to Sid is output. When this occurs, the output resistance value of the driver unit 260 is an overall resistance value of the transistors Mg, Mm and the resistor element 264, or the overall resistance value of the transistors Mh, Mn and the resistor element 264.

In the driver unit 260, operation of the transistors Mg, Mh is ended by switching off each of the switching transistors Mm, Mn. The switching circuit 266 is accordingly capable of performing switching between operation/non-operation of the driver unit 260 according to the adjustment code Cc.

FIG. 21B illustrates a driver unit 270. The driver unit 270 includes a unit circuit 272. The unit circuit 272 is equipped with transistors Mg, Mh that operate in a complementary manner, and a resistor element 274. The driver unit 270 includes a switching circuit 276. The switching circuit 276 includes a transmission gate (referred to below as TG) 278 and an inverter 280.

The TG 278 of the switching circuit 276 is connected on the input side to a node 282 between the transistor Mg and the transistor Mh, and is connected on the output side to the resistor element 274. The driver unit 270 thereby outputs a signal of voltage according to the signals Sia to Sid through the resistor element 274 by making the TG 278 of the switching circuit 2760N. By making the TG 278 OFF, the path between the transistors Mg, Mh and the resistor element 274 is open in the driver unit 270, and voltage output is stopped even if signals Sia to Sid are input.

In the switching circuit 276, the TG 278 is connected to the inverter 280 at a control terminal 278p of a PMOS transistor or a control terminal 278n of an NMOS transistor. Note that in the switching circuit 276, as an example the inverter 280 is connected to the control terminal 278p.

In the switching circuit 276, the adjustment code Cc is input to the control terminal 278n of the TG 278, and the adjustment code Cc inverted by the inverter 280 (adjustment code Ccx) is input to the control terminal 278p of the TG 278. The TG 278 is switched ON or OFF by the adjustment code Cc. The driver unit 270 accordingly switches between voltage output/non-output by the adjustment code Cc input to the switching circuit 276.

FIG. 22 illustrates a driver unit 284. The driver unit 284 includes a unit circuit 286. The unit circuit 286 includes transistors Mg, Mh that operate in a complementary manner, and a resistor element 288. The driver unit 284 includes a switching circuit 290. The switching circuit 290 includes a transistor Mr for which a PMOS transistor is employed, a transistor Ms for which an NMOS transistor is employed, 2 transmission gates (TG) 292, 294 and an inverter 296.

The TG 292 of the switching circuit 290 is provided on the gate G side of the transistor Mg of the unit circuit 286, and opens or closes between the gate G of the transistor Mg and the signal input side of the driver unit 284. The TG 294 is provided on the gate G side of the transistor Mh of the unit circuit 286, and opens or closes between the gate G of the transistor Mh and the signal input side of the driver unit 284.

The transistor Mr of the switching circuit 290 is provided between the transistor Mg of the unit circuit 286 and the TG 292, the drain D of the transistor Mr is connected to the gate G of the transistor Mg, and the source S of the transistor Mr is applied with a voltage Vdd. The transistor Ms is provided between the transistor Mh and the TG 294, the drain D of the transistor Ms is connected to the gate G of the transistor Mh, and the source S of the transistor Ms is connected to ground.

In the switching circuit 290, the gate G of the transistor Mg of the unit circuit 286 is applied with the voltage Vdd by making the transistor Mr ON, and the gate G of the transistor Mh of the unit circuit 286 is connected to ground by making the transistor Ms ON. In the unit circuit 286, operation of the transistor Mg is stopped by applying the voltage Vdd to the gate G of the transistor Mg, and operation of the transistor Mh is stopped by connecting the gate G of the transistor Mh to ground.

In the switching circuit 290, the signals Sia to Sid are input to the gate G of the transistor Mg and the gate G of the transistor Mh by making the TG 292, 294 ON. In the switching circuit 290 the unit circuit 286 is isolated from the signal input side of the driver unit 284 by making the TG 292, 294 OFF.

In the switching circuit 290, as an example, the adjustment code Cc is input to the gate G of the transistor Mr and the control terminals 292n, 294n of the gate side of each of the respective NMOS transistors of the TG 292, 294. In the switching circuit 290, the adjustment code Cc is inverted by the inverter 296, and input as the adjustment code Ccx to the gate G of the transistor Ms and the control terminals 292p, 294p of the gate side of each of the respective PMOS transistors of the TG 292, 294.

Thus in the switching circuit 290, switching the transistors Mr, Ms and the TG 292, 294 are switched ON or OFF according to the adjustment code Cc. In the switching circuit 290, both the TG 292, 294 are ON when both the transistors Mr, Ms are OFF, and both the TG 292, 294 are OFF when both the transistors Mr, Ms are ON.

In the driver unit 284, a signal is output through the resistor element 288 with voltage according to the signals Sia to Sid by making both the transistors Mr, Ms of the switching circuit 2900FF, and by making both the TG 292, 294 ON. In the driver unit 284, operation of the transistors Mg, Mh is stopped by making both the transistors Mr, Ms of the switching circuit 2900N and making both the TG 292, 294 OFF.

Consequently, in the driver unit 284, by providing the switching circuit 290 the operation/non-operation of the transistors Mg, Mh is switched according to the adjustment codes Cc (Cca to Ccd). Moreover, in the driver unit 284, the path between the signal input side and the unit circuit 286 is opened when operation of the transistors Mg, Mh is stopped.

An aspect of technology disclosed herein exhibits the advantageous effect of enabling suppression of changes in the electrical characteristics caused by changes in the characteristics of resistor functional elements provided in an operation unit circuit.

The technology disclosed herein is not limited to the exemplary embodiments described above, and configuration may be made with embodiments including the target function of each of the portions thereof. Moreover, all cited documents, patent applications and technical standards mentioned in the present specification are incorporated by reference in the present specification to the same extent as if the individual cited documents, patent applications and technical standards were specifically and individually incorporated by reference in the present specification.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A signal transmission circuit, comprising:
   a plurality of driver circuits that each include a plurality of operation unit circuits formed so as to have a specific output resistance value and operating so as to output a voltage according to an input signal, an output resistance value of the operation unit circuits being set according to a pre-set output resistance value for each of the plurality of driver circuits, with an operation number of the operation unit circuits being connected together in parallel and operated, as a result of setting the operation number of the operation unit circuits, such that signals are output from the plurality of driver circuits with a voltage according to the input signal, and with the plurality of driver circuits being connected together in parallel such that the output signals are combined together;
   an individual detection section that includes replica circuits provided so as to correspond to at least two driver circuits out of the plurality of driver circuits and having resistance values corresponding to the output resistance value of one of the operation unit circuits, and that detects an output voltage of each of the replica circuits; and
   a setting section that, based on a voltage ratio between an output voltage of a replica circuit corresponding to one driver circuit out of the at least two driver circuits detected by the individual detection section and an output voltage of a replica circuit corresponding to another driver circuit out of the at least two driver circuits, computes a ratio for at least one of the driver circuits based on the output resistance value of each of the plurality of driver circuits, and sets an operation number of operation unit circuits to operate in each of the plurality of driver circuits from the ratio based on the output resistance value computed for the at least one of the driver circuits and from a ratio based on the pre-set output resistance values for the plurality of driver circuits, such that the output resistance value of each of the plurality of driver circuits becomes the pre-set output resistance value.

2. The signal transmission circuit of claim 1, further comprising:
   a basic detection section that includes a plurality of replica circuits that each correspond to one operation unit circuit of the respective driver circuits and that each have a resistance value that corresponds to the output resistance value of the corresponding operation unit circuit, and that detects an output voltage of an overall replica circuit configured by the plurality of replica circuits connected together in parallel; and
   a basic setting section that sets a basic operation number, based on the voltage detected by the basic detection section, so as to set a specific value as a final terminal resistance value, which is an overall output resistance value of the plurality of driver circuits, where the same number of operation unit circuits are connected together in parallel in each of the plurality of driver circuits,
   wherein the setting section sets the operation number of the operation unit circuits of each of the plurality of driver circuits from the basic operation number, from the ratio based on the output resistance value computed for the at least one driver circuit and from the ratio based on the pre-set output resistance values of the plurality of driver circuits, such that the output resistance value of each of the plurality of driver circuits becomes the pre-set output resistance value.

3. The signal transmission circuit of claim 2, wherein the setting section includes:
   a resistance value setting section that employs a weighting, obtained from an inverse ratio of the ratio of the pre-set output resistance values, as the ratio based on the pre-set output resistance values and sets a resistance value per unit weighting of the operation unit circuits for obtaining the final terminal resistance value, based on a weighting for each of the plurality of driver circuits and based on the basic operation number; and an individual setting section that sets the operation number of the operation unit circuits for each of the driver circuits based on the resistance value per unit weighting, a computed weighting for the at least one driver circuit, and weightings for the pre-set output resistance values of each of the plurality of driver circuits, such that the output resistance value of each of the plurality of driver circuits becomes the pre-set output resistance value.

4. The signal transmission circuit of claim 1, wherein:

the individual detection section includes a replica circuit corresponding to a driver circuit having the largest pre-set output resistance value as one of the replica circuits corresponding to the respective at least two driver circuits, and the setting section computes a ratio of an output resistance value of the at least one driver circuit using, as a reference, the driver circuit having the largest pre-set output resistance value.

5. The signal transmission circuit of claim 1, wherein:

the individual detection section includes a replica circuit corresponding to a driver circuit having the smallest pre-set output resistance value as one of the replica circuits corresponding to the respective at least two driver circuits, and the setting section computes a ratio of an output resistance value of the driver circuit having the smallest pre-set output resistance value.

6. A semiconductor integrated circuit, comprising:

a splitter section that splits an input signal into a plurality of branches;

a plurality of driver circuits that each include a plurality of operation unit circuits formed so as to have a specific output resistance value and operating so as to output a voltage according to an input signal split by the splitter section, an output resistance value of the operation unit circuits being set according to a pre-set output resistance value for each of the plurality of driver circuits, with an operation number of the operation unit circuits being connected together in parallel and operated, as a result of setting the operation number of the operation unit circuits, such that signals are output from the plurality of driver circuits with a voltage according to the input signal, and with one of the plurality of driver circuits being provided for each of the signals split by the splitter section and the plurality of driver circuits being connected together in parallel such that the output signals are combined together;

an individual detection section that includes replica circuits provided so as to correspond to at least two driver circuits out of the plurality of driver circuits and having resistance values corresponding to the output resistance value of one of the operation unit circuits, and that detects an output voltage of each of the replica circuits; and a setting section that computes a ratio, based on output resistance value of each of the plurality of driver circuits, for at least one of driver circuits based on a voltage ratio between an output voltage of a replica circuit corresponding to one driver circuit out of the at least two driver circuits detected by the individual detection section and an output voltage of a replica circuit corresponding to another driver circuit out of the at least two driver circuits detected by the individual detection section, and sets an operation number of operation unit circuits to operate in each of the plurality of driver circuits from the ratio based on the output resistance value computed for the at least one of the driver circuits and from a ratio based on the pre-set output resistance values for the plurality of driver circuits, such that the output resistance value of each of the plurality of driver circuits becomes the pre-set output resistance value.

7. The semiconductor integrated circuit of claim 6, further comprising:

a basic detection section that includes a plurality of replica circuits that each correspond to one operation unit circuit of the respective driver circuits and that each have a resistance value that corresponds to the output resistance value of the corresponding operation unit circuit, and that detects an output voltage of an overall replica circuit configured by the plurality of replica circuits connected together in parallel; and a basic setting section that sets a basic operation number, based on the voltage detected by the basic detection section, so as to set a specific value as a final terminal resistance value, which is an overall output resistance value of the plurality of driver circuits, where the same number of operation unit circuits are connected together in parallel in each of the plurality of driver circuits, wherein the setting section sets the operation number of the operation unit circuits of each of the plurality of driver circuits from the basic operation number, from the ratio based on the output resistance value computed for the at least one driver circuit and from the ratio based on the pre-set output resistance values of the plurality of driver circuits, such that the output resistance value of each of the plurality of driver circuits becomes the pre-set output resistance value.

8. The semiconductor integrated circuit of claim 7, wherein the setting section includes:

a resistance value setting section that employs a weighting, obtained from an inverse ratio of the ratio of the pre-set output resistance values, as the ratio based on the pre-set output resistance values and sets a resistance value per unit weighting of the operation unit circuits for obtaining the final terminal resistance value, based on a weighting for each of the plurality of driver circuits and based on the basic operation number; and an individual setting section that sets the operation number of the operation unit circuits for each of the driver circuits based on the resistance value per unit weighting, a computed weighting for the at least one driver circuit, and weightings for the pre-set output resistance values of each of the plurality of driver circuits, such that the output resistance value of each of the plurality of driver circuits becomes the pre-set output resistance value.

9. The semiconductor integrated circuit of claim 6, wherein:

the individual detection section includes a replica circuit corresponding to a driver circuit having the largest pre-set output resistance value as one of the replica circuits corresponding to the respective at least two driver circuits, and the setting section computes a ratio of an output resistance value of the at least one driver circuit using, as a reference, the driver circuit having the largest pre-set output resistance value.

10. The semiconductor integrated circuit of claim 6, wherein:

the individual detection section includes a replica circuit corresponding to a driver circuit having the smallest pre-set output resistance value as one of the replica circuits corresponding to the respective at least two driver circuits, and the setting section computes a ratio of an output resistance value of the driver circuit having the smallest pre-set output resistance value.

11. A signal transmission circuit adjustment method, comprising:

connecting together in parallel a plurality of driver circuits that each include a plurality of operation unit circuits formed so as to have a specific output resistance value and operating so as to output a voltage according to an input signal, an output resistance value of the operation unit circuits being set according to a pre-set output resistance value for each of the plurality of driver circuits, with an operation number of the operation unit circuits being connected together in parallel and operated, as a result of setting the operation number of the operation unit circuits, such that signals are output from the plurality of driver circuits with a voltage according to the input signal, and with the plurality of driver circuits being connected together in parallel such that the output signals are combined together;

detecting an output voltage of respective replica circuits using an individual detection section that includes the replica circuits, which are provided so as to correspond to at least two driver circuits out of the plurality of driver circuits and have a resistance value corresponding to the output resistance value of one of the operation unit circuits;

computing a ratio based on an output resistance value of each of the plurality of driver circuits for at least one of driver circuits based on a voltage ratio between an output voltage of a replica circuit corresponding to one driver circuit out of the at least two driver circuits detected by the individual detection section and an output voltage of a replica circuit corresponding to another driver circuit out of the at least two driver circuits detected by the individual detection section; and setting an operation number of operation unit circuits to operate in each of the plurality of driver circuits from a ratio based on the output resistance value computed for the at least one of the driver circuits and from a ratio based on the pre-set output resistance values for the plurality of driver circuits, such that the output resistance value of each of the plurality of driver circuits becomes the pre-set output resistance value.

12. The adjustment method of claim 11, wherein:

an output voltage of an overall replica circuit is detected using a basic detection section that includes a plurality of replica circuits that each correspond to one operation unit circuit of the respective driver circuits and that each have a resistance value that corresponds to the output resistance value of the corresponding operation unit circuit, and the overall replica circuit is configured by the plurality of replica circuits connected together in parallel;

a basic operation number is set, based on the voltage detected by the basic detection section, so as to set a specific value as a final terminal resistance value, which is an overall output resistance value of the plurality of driver circuits, where the same number of operation unit circuits are connected together in parallel in each of the plurality of driver circuits; and the operation number of the operation unit circuits of each of the plurality of driver circuits is set from the basic operation number, from the ratio based on the output resistance value computed for the at least one driver circuit, and from the ratio based on the pre-set output resistance values of the plurality of driver circuits such that the output resistance value of each of the plurality of driver circuits becomes the pre-set output resistance value.

13. The adjustment method of claim 12, wherein:

a weighting, obtained from an inverse ratio of the ratio of the pre-set output resistance values, is employed as the ratio based on the pre-set output resistance values, and a resistance value per unit weighting of the operation unit circuits, for obtaining the final terminal resistance value, is set based on a weighting for each of the plurality of driver circuits and based on the basic operation number; and the operation number of the operation unit circuits for each of the driver circuits is set based on the resistance value per unit weighting, the computed weighting for the at least one driver circuit, and weightings for the pre-set output resistance values of each of the plurality of driver circuits, such that each of the plurality of driver circuits has the pre-set output resistance value.

14. The adjustment method of claim 11, wherein:

the individual detection section includes a replica circuit corresponding to a driver circuit having the largest pre-set output resistance value as one of the replica circuits corresponding to the respective at least two driver circuits, and a ratio of an output resistance value of the at least one driver circuit is computed using, as a reference, the driver circuit having the largest pre-set output resistance value, in order to set the operation number of the operation unit circuits for each of the driver circuits.

15. The adjustment method of claim 11, wherein:

the individual detection section includes a replica circuit corresponding to a driver circuit having the smallest pre-set output resistance value as one of the replica circuits corresponding to the respective at least two driver circuits, and a ratio of an output resistance value is computed for the driver circuit with the smallest pre-set output resistance value, in order to set the operation number of the operation unit circuits for each of the driver circuits.

* * * * *